(12) United States Patent
Nishihara

(10) Patent No.: US 10,014,332 B2
(45) Date of Patent: Jul. 3, 2018

(54) PIXEL CIRCUIT, SEMICONDUCTOR PHOTODETECTION DEVICE, AND RADIATION COUNTING DEVICE

(71) Applicant: SONY SEMICONDUCTOR SOLUTIONS CORPORATION, Kanagawa (JP)

(72) Inventor: Toshiyuki Nishihara, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 15/328,596

(22) PCT Filed: Jun. 16, 2015

(86) PCT No.: PCT/JP2015/067244
§ 371 (c)(1),
(2) Date: Jan. 24, 2017

(87) PCT Pub. No.: WO2016/017305
PCT Pub. Date: Feb. 4, 2016

(65) Prior Publication Data
US 2017/0207257 A1     Jul. 20, 2017

(30) Foreign Application Priority Data
Jul. 31, 2014 (JP) .................................. 2014-155746

(51) Int. Cl.
*G01T 1/20* (2006.01)
*H01L 27/146* (2006.01)
(Continued)

(52) U.S. Cl.
CPC ........ *H01L 27/1461* (2013.01); *G01J 1/4228* (2013.01); *G01T 1/20* (2013.01);
(Continued)

(58) Field of Classification Search
CPC ...... G01J 1/4228; G01T 1/20; H01L 27/1443; H01L 27/1446; H01L 27/1464;
(Continued)

(56) References Cited

U.S. PATENT DOCUMENTS

2010/0141927 A1* 6/2010 Hashimoto ....... H01L 27/14812
356/4.01

FOREIGN PATENT DOCUMENTS

JP    2010-136281 A    6/2010
JP    2014-60705 A    4/2014
(Continued)

OTHER PUBLICATIONS

International Search Report prepared by the Japan Patent Office dated Aug. 3, 2015, for International Application No. PCT/JP2015/067244.

*Primary Examiner* — David Porta
*Assistant Examiner* — Faye Boosalis
(74) *Attorney, Agent, or Firm* — Sheridan Ross P.C.

(57) ABSTRACT

In a photoelectric changing unit, a photoelectric conversion unit converts light into electric charge, and an electric charge accumulation unit accumulates the electric charge in a polygonal area whose plurality of sides are adjacent to the photoelectric conversion unit on a light receiving surface. A voltage generation unit accumulates the electric charge and generates a voltage according to an amount of the accumulated electric charge. A first transfer unit transfers the electric charge from the photoelectric conversion unit to the electric charge accumulation unit when an instruction on a transfer to the electric charge accumulation unit is issued. A second transfer unit transfers the electric charge from the electric charge accumulation unit to the voltage generation unit when an instruction on a transfer to the voltage generation unit is issued.

9 Claims, 20 Drawing Sheets

(51) Int. Cl.
*G01J 1/42* (2006.01)
*H01L 27/144* (2006.01)
*H04N 5/374* (2011.01)
*H04N 5/357* (2011.01)
*H04N 5/378* (2011.01)
*H04N 5/353* (2011.01)

(52) U.S. Cl.
CPC ...... *H01L 27/1443* (2013.01); *H01L 27/1446* (2013.01); *H01L 27/1464* (2013.01); *H01L 27/14603* (2013.01); *H01L 27/14616* (2013.01); *H01L 27/14643* (2013.01); *H01L 27/14678* (2013.01); *H04N 5/353* (2013.01); *H04N 5/357* (2013.01); *H04N 5/374* (2013.01); *H04N 5/378* (2013.01)

(58) Field of Classification Search
CPC ......... H01L 27/14616; H01L 27/14643; H01L 27/14603; H01L 27/1461; H01L 27/14685; H04N 5/378; H04N 5/357; H04N 5/374; H04N 5/353
See application file for complete search history.

(56) References Cited

FOREIGN PATENT DOCUMENTS

WO    WO 2013/118646 A1    8/2013
WO    WO 2013/157448 A1    10/2013

\* cited by examiner

FIG. 6
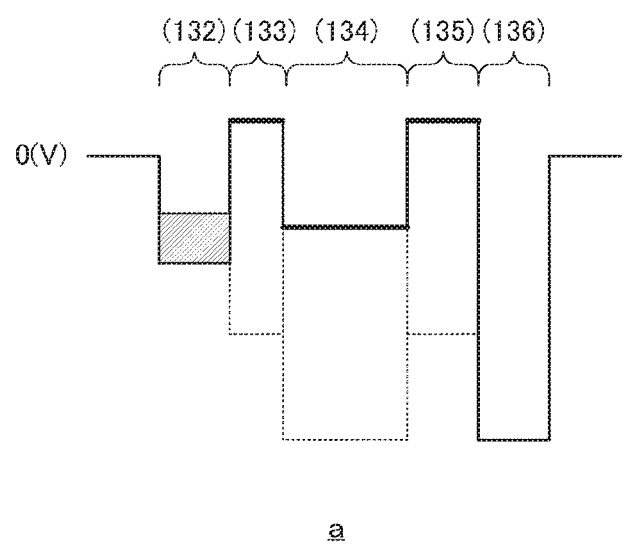
a
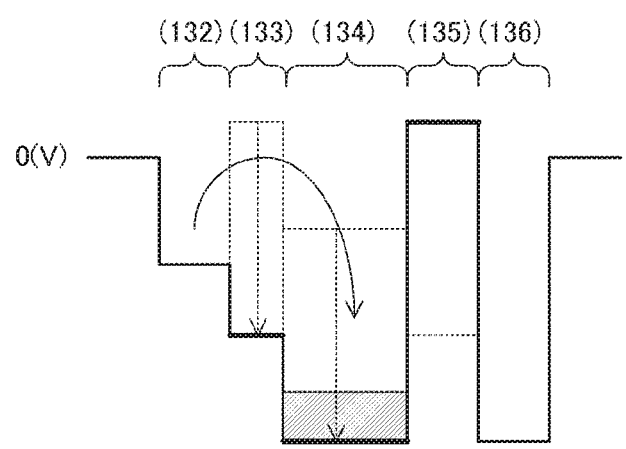
b

FIG. 7
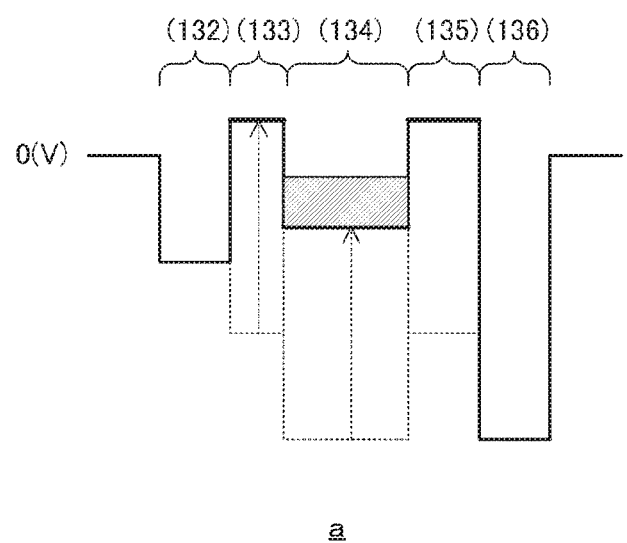
a
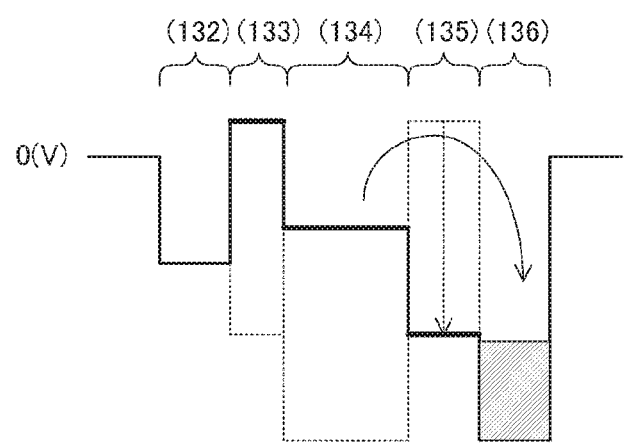
b

PIXEL CIRCUIT, SEMICONDUCTOR PHOTODETECTION DEVICE, AND RADIATION COUNTING DEVICE

CROSS REFERENCE TO RELATED APPLICATIONS

This application is a national stage application under 35 U.S.C. 371 and claims the benefit of PCT Application No PCT/JP2015/067244 having an international filing date of 16 Jun. 2015, which designated the United States, which PCT application claimed the benefit of Japanese Patent Application No. 2014-155746 filed 31 Jul. 2014, the disclosures of which are incorporated herein by reference in their entirety.

TECHNICAL FIELD

The present technology relates to a pixel circuit, a semiconductor photodetection device, and a radiation counting device. Particularly, the technology relates to a pixel circuit, a semiconductor photodetection device, and a radiation counting device used for a photon counter.

BACKGROUND ART

In recent years, complementary metal-oxide semiconductor (CMOS) imagers have been increasingly widely used in digital still cameras, camcorders, surveillance cameras, and the like and also the market thereof has increasingly expanded. In such a CMOS imager, each pixel circuit converts incident light into electrons using a photodiode, accumulates the electrons for a fixed period, and then outputs a signal reflecting the amount of accumulated electric charge thereof to an analog-to-digital (AD) converter built in a chip. The AD converter digitizes the signal, and then outputs the digitized signal to the following stage. In the CMOS imager, pixels are disposed in a matrix shape for imaging.

A general pixel circuit is provided with a photodiode, a transfer transistor, a reset transistor, an amplifier transistor, a floating diffusion layer, a selection transistor, and the like. Photons incident on a silicon substrate of the pixel circuit generate pairs of electrons and holes, and then the photodiode accumulates the electrons in a node on the side of cathode of the photodiode. The electrons are transferred to the floating diffusion layer by switching on the transfer transistor at a predetermined timing to drive the gate of the amplifier transistor. Thus, signal charge turns into signals of vertical signal lines to be read through the selection transistor.

The amplifier transistor and the vertical signal line are connected with a constant current circuit. The constant current circuit configures a source follower. In addition, a signal of a charge accumulation layer is somewhat attenuated with a gain of slightly less than 1, and output to the vertical signal line.

In addition, the reset transistor is switched on at the same time as the transfer transistor, takes out the electrons accumulated in the photodiode to a power supply, and thereby resets the pixel circuit to a dark state before the accumulation, i.e., a state of no incident light. As the power supply used for the reset and source follower, for example, 3 V is supplied.

Such a CMOS imager has had decreased parasitic capacitance inside pixel circuits due to miniaturization of the recent years, which improves conversion efficiency and sensitivity. Here, a detection node that is an amplifier input of the above-described source follower is formed with a drain diffusion layer of a transfer transistor, a gate electrode of the amplifier transistor, and wiring which connects both. If parasitic capacitance decreases due to miniaturization, a potential of the detection node for signal charge generated by the photodiode significantly fluctuates accordingly, a pixel output to signal lines via the source follower also increases accordingly, and thus sensitivity improves.

Furthermore, CMOS imagers have exhibited improved crystal quality of substrates, and a reduction of dark currents and low noise of amplifier transistors have progressed. In other words, the signal-to-noise (S/N) ratios of signals have remarkably improved, and according to such trends, a device that uses this as an optical detector that deals with ultra-weak light such as fluorescence has been proposed (for example, see Patent Literature 1).

As one of expected applications, a radiation counting device combined with a scintillator is exemplified. Radiation counting (photon counting), in which a dose of radiations incident on a detector is counted while energy of the respective radiations is distinguished in units of incident photons, has been recently applied to various fields, such as dosimeters and gamma cameras. As such detectors, scintillators and photomultiplier tubes have been mainly used in recent years. If such a detector is replaced with a CMOS imager, a dramatic reduction in size and weight of the device can be realized. Further, the radiation counting method can also be introduced to X-ray imaging and computed tomography (CT) imaging that require high spatial resolution, and a drastic reduction in an exposure dose can be realized.

CITATION LIST

Patent Literature

Patent Literature 1: JP2011-97581A

DISCLOSURE OF INVENTION

Technical Problem

A size of a pixel of a current CMOS imager is about 4×4 square micrometers ($\mu m^2$) at most. By minimizing parasitic capacitance of the above-described detection node to raise an S/N ratio and suppressing noise of a detection circuit or the like, random noise coming from output of each pixel is assumed to be suppressed to about one electron signal.

Here, if it is attempted to receive light generated from a scintillator of 5×5 square millimeters ($mm^2$), for example, 1250×1250 pixels can receive the light. The total pixel noise of this time is obtained from the following expression indicating the root mean square (RMS) of the electron signal.

$$(1^2 \times 1250 \times 1250)^{1/2} = 1250 \qquad \text{Expression 1}$$

Based on Expression 1, irregularity of 1250 electrons occurs in the output. Thus, there is a problem of not obtaining sufficient energy resolution in radiation counting. Furthermore, it is necessary to read data sequentially from pixels of 1250 rows for one pulse of scintillation light, and thus it is not possible to respond to incidence of the next radiation for the time being. That is, it is difficult to raise a counting rate.

Increasing the size of a pixel is effective to raise energy resolution and a counting rate, however, pixels of CMOS imagers of the past have a problem in that it is not possible to increase a size of each pixel while an S/N ratio is maintained with respect to weak light. This is mainly because of the following reason. That is, it is not possible to increase parasitic capacitance of a detection node to maintain an output signal. Accordingly, it is not possible to expand the area of the detection node according to the size of each pixel. However, when a photodiode is set to be large while the area of the detection node is set to be small, it is necessary to reliably bring one or several electrons generated in the photodiode due to ultra-weak light to the detection node. Even if a potential gradient is given by adjusting an impurity profile, there is a limit on a movement distance thereof. However, hardly any specific methods for realizing large pixels having high sensitivity and a high aperture ratio while the area of a detection node is maintained to be extremely small have been researched.

The present technology has been conceived taking the above circumstances into account, and aims to increase a size of each pixel of an image sensor.

Solution to Problem

The present technology is achieved for solving the above-mentioned problem, and a first aspect of the present technology is to provide a pixel circuit including: a photoelectric conversion unit configured to convert light into electric charge; an electric charge accumulation unit configured to accumulate the electric charge in a polygonal area whose plurality of sides are adjacent to the photoelectric conversion unit on a light receiving surface; a voltage generation unit configured to accumulate the electric charge and generate a voltage according to an amount of the accumulated electric charge; a first transfer unit configured to transfer the electric charge from the photoelectric conversion unit to the electric charge accumulation unit when an instruction on a transfer to the electric charge accumulation unit is issued; and a second transfer unit configured to transfer the electric charge from the electric charge accumulation unit to the voltage generation unit when an instruction on a transfer to the voltage generation unit is issued. Thus, the effect that electric charge is transferred to the electric charge accumulation unit that accumulates electric charge in the polygonal area of which the plurality of sides thereof are adjacent to the photoelectric conversion unit and the electric charge is transferred from the electric charge accumulation unit to the voltage generation unit is exhibited.

According to the first aspect, the electric charge accumulation unit may convert light into electric charge, and accumulates the converted electric charge and the transferred electric charge. Thus, the effect that the photoelectrically converted electric charge and the transferred electric charge are accumulated is exhibited.

According to the first aspect, the electric charge accumulation unit may include a first intermediate node configured to accumulate the electric charge, and a second intermediate node configured to accumulate the electric charge in a polygonal area whose plurality of sides are adjacent to the first intermediate node, and the first transfer unit may include a first transfer transistor configured to transfer the electric charge from the photoelectric conversion unit to the first intermediate node when an instruction on a transfer to the first intermediate node is issued, and a second transfer transistor configured to transfer the electric charge from the first intermediate node to the second intermediate node when an instruction on a transfer to the second intermediate node is issued. Thus, the effect that the electric charge is transferred to the first intermediate node from the photoelectric conversion unit and the electric charge is transferred to the second intermediate node from the first intermediate node is exhibited.

According to the first aspect, at least one of the first intermediate node and the second intermediate node may convert light into electric charge and may accumulate the converted electric charge and the transferred electric charge. Thus, the effect that the photoelectrically converted electric charge and the transferred electric charge are accumulated in at least one of the first and the second intermediate nodes is exhibited.

According to the first aspect, the pixel circuit may further include a wiring layer provided on one of two flat surfaces that the photoelectric conversion unit faces. The light may be radiated to a rear surface which is a surface on which the wiring layer is not provided out of the two flat surfaces. Thus, the effect that light is radiated to the rear surface is exhibited.

A second aspect of the present technology is to provide a semiconductor photodetection device including: a photoelectric conversion unit configured to convert light into electric charge; an electric charge accumulation unit configured to accumulate the electric charge in a polygonal area whose plurality of sides are adjacent to the photoelectric conversion unit on a light receiving surface; a voltage generation unit configured to accumulate the electric charge and generate a voltage according to an amount of the accumulated electric charge, a first transfer unit configured to transfer the electric charge from the photoelectric conversion unit to the electric charge accumulation unit when an instruction on a transfer to the electric charge accumulation unit is issued; a second transfer unit configured to transfer the electric charge from the electric charge accumulation unit to the voltage generation unit when an instruction on a transfer to the voltage generation unit is issued; and a detection unit configured to detect a light amount of light based on the generated voltage. Thus, the effect that electric charge is transferred to the electric charge accumulation unit that accumulates electric charge in the polygonal area of which the plurality of sides thereof are adjacent to the photoelectric conversion unit and the electric charge is transferred from the electric charge accumulation unit to the voltage generation unit is exhibited.

A third aspect of the present technology is to provide a radiation counting device including: a scintillator configured to emit scintillation light when a radiation enters; a pixel array unit that has a plurality of pixel circuits each of which includes a photoelectric conversion unit configured to convert the scintillation light into electric charge, an electric charge accumulation unit configured to accumulate the electric charge in a polygonal area whose plurality of sides are adjacent to the photoelectric conversion unit on a light receiving surface, a voltage generation unit configured to accumulate the electric charge and generate a voltage according to an amount of the accumulated electric charge, a first transfer unit configured to transfer the electric charge from the photoelectric conversion unit to the electric charge accumulation unit when an instruction on a transfer to the electric charge accumulation unit is issued, and a second transfer unit configured to transfer the electric charge from the electric charge accumulation unit to the voltage generation unit when an instruction on a transfer to the voltage generation unit is issued; and a detection unit configured to detect a light amount of light based on the generated voltage. Thus, the effect that electric charge is transferred to the electric charge accumulation unit that accumulates electric charge in the polygonal area of which the plurality of sides thereof are adjacent to the photoelectric conversion unit and the electric charge is transferred from the electric charge accumulation unit to the voltage generation unit is exhibited.

According to the third aspect, the scintillator may be divided into a plurality of compartments, and the detection unit may detect the light amount of light of each of the plurality of compartments. Thus, the effect that a light amount is detected for each compartment is exhibited.

According to the third aspect, the detection unit may detect the light amount of each of the plurality of pixel circuits. Thus, the effect that a light amount is detected for each pixel is exhibited.

According to the third aspect, the pixel array unit may be divided into a plurality of pixel blocks each having a predetermined number of the pixel circuits, and the detection unit may detect the light amount of each of the plurality of pixel blocks. Thus, the effect that a light amount is detected for each pixel block is exhibited.

Advantageous Effects of Invention

According to the present technology, an excellent effect of increasing a size of each pixel of an image sensor can be exhibited. Note that effects described herein are not necessarily limitative, and any of effects described in the present disclosure may be exhibited.

BRIEF DESCRIPTION OF DRAWINGS

FIG. 6 shows potential diagrams for describing transfer of electric charge to an intermediate node according to the first embodiment.

FIG. 7 is a diagram for describing transfer of electric charge to a detection node according to the first embodiment.

MODE(S) FOR CARRYING OUT THE INVENTION

Preferred embodiments for implementing the present technology (hereinafter referred to as embodiments) will be described below. Description will be provided in the following order.

1. First embodiment (Example in which electric charge is accumulated in area whose plurality of sides are adjacent to photoelectric conversion unit)
2. Second embodiment (Example in which accumulation of light exposure is performed in area whose plurality of sides are adjacent to photoelectric conversion unit)
3. Third embodiment (Example in which electric charge is accumulated in plurality of areas whose plurality of sides are adjacent to photoelectric conversion unit)

1. First Embodiment

Configuration Example of Image Sensor

Figure 1:
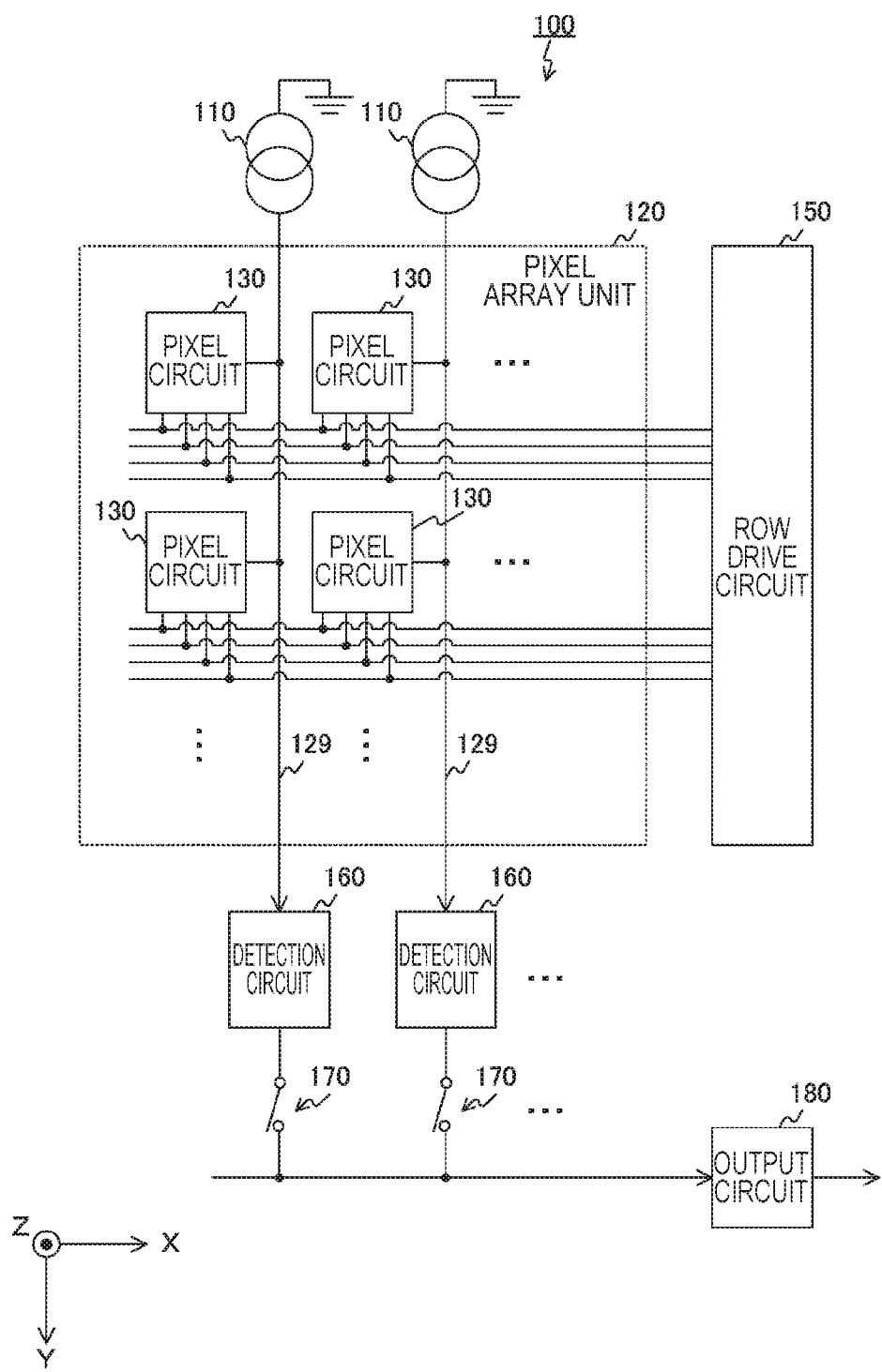
FIG. 1 is a block diagram showing an example of a configuration of an image sensor according to a first embodiment.

FIG. 1 is a block diagram showing an example of a configuration of an image sensor 100 according to a first embodiment. The image sensor 100 has a plurality of constant current circuits 110, a pixel array unit 120, a row drive circuit 150, a plurality of detection circuits 160, a plurality of switches 170, and an output circuit 180. The image sensor 100 is an example of a semiconductor photo-detection device described in claims.

A plurality of pixel circuits 130 are arranged in the pixel array unit 120 in a two-dimensional matrix shape. Hereinafter, the plurality of pixel circuits 130 arranged in a predetermined X direction are referred to as a "row" and the plurality of pixel circuits 130 arranged in a Y direction that is vertical to the row are referred to as a "column". The above-described constant current circuit 110, the detection circuit 160, and the switch 170 are provided in each column.

The pixel circuit 130 converts light into an analog electric signal according to the control of the row drive circuit 150. The pixel circuit 130 supplies the electric signal to the corresponding detection circuit 160 through a vertical signal line 129.

The row drive circuit 150 controls the respective pixel circuits 130 through a plurality of control lines. This row drive circuit 150 causes all rows to be simultaneously exposed, and selects the rows in order after the exposure is completed to cause the pixel circuits 130 in the selected rows to output electric signals. These electric signals are read by the detection circuits 160. The control to cause all pixels to be simultaneously exposed as described above is called a global shutter method. Details of the control at the time of exposure and reading will be described below. Note that the row drive circuit 150 may use a rolling shutter method in which respective rows are exposed in order.

Each of the constant current circuits 110 generates a constant current, and supplies the same to the corresponding vertical signal line 129.

Each of the detection circuits 160 performs photodetection based on an electric signal. This detection circuit 160 performs A-D conversion and a correlated double sampling (CDS) process on the electric signal to detect light. The detection circuit 160 supplies a digital signal indicating the detection result to the switch 170. Note that the detection circuit 160 is an example of a detection unit described in the claims.

Each of the switches 170 opens and closes a path between the corresponding detection circuit 160 and the output circuit 180. The switches 170 of the respective columns sequentially supply digital signals to the output circuit 180 according to the control of a column drive circuit (not illustrated) which sequentially selects the columns.

The output circuit 180 outputs a digital signal to an image processing apparatus and the like. The completion of the output of the digital signals of all the rows results in the completion of the output of image data of one frame.

Example of Configuration of Pixel Circuit

Figure 2:
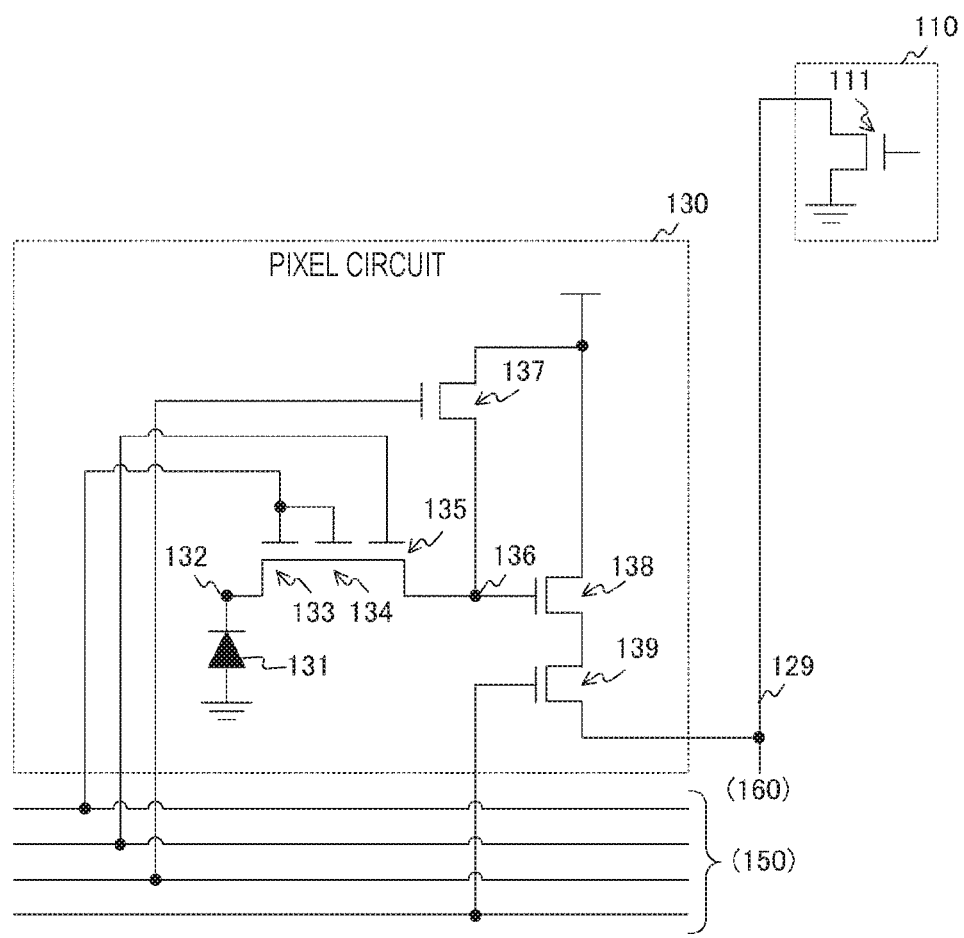
FIG. 2 is a circuit diagram showing an example of a pixel circuit according to the first embodiment.

FIG. 2 is a circuit diagram showing an example of a pixel circuit 130 according to the first embodiment. This pixel circuit 130 includes a photodiode 131, a node 132, a transfer transistor 133, an intermediate node 134, another transfer transistor 135, and a detection node 136. In addition, the pixel circuit 130 includes a reset transistor 137, an amplifier transistor 138, and a selection transistor 139. As the transfer transistors 133 and 135, and the intermediate node 134, for example, n-type metal-oxide semiconductor (MOS) transistors are used. In addition, as the reset transistor 137, the amplifier transistor 138, and the selection transistor 139, for example, n-type MOS transistors are used.

The photodiode 131 converts light into electric charge. The photodiode 131 is, for example, an embedded type photodiode, in which an n-type node diffusion layer is surrounded by a p-type well diffusion layer. This node diffusion layer is brought into a complete depletion-state by biasing the well diffusion layer about 1V, and thus all accumulated carriers are drawn out. This node diffusion layer corresponds to the node 132.

In addition, the photodiode 131 is connected to the transfer transistor 133 via the node 132. The photodiode 131 generates pairs of electrons and holes from photons incident on a silicon substrate of the pixel circuit 130, and accumulates electrons among them in the node 132. Note that the photodiode 131 is an example of a photoelectric conversion unit described in the claims.

The transfer transistor 133, the intermediate node 134, and the transfer transistor 135 are a 3-stage transistor having a series field effect transistor (FET) structure in which no conductivity type diffusion layer is interposed between their channels. The source of the transfer transistor 133 is connected to the photodiode 131, and the gate thereof is connected to the gate of the intermediate node 134 and the row drive circuit 150. The gate of the transfer transistor 135 is connected to the row drive circuit 150, and the drain thereof is connected to the detection node 136.

Among these transistors, the transfer transistor 133 transfers electric charge from the photodiode 131 to the intermediate node 134 under control of the row drive circuit 150. Note that the transfer transistor 133 is an example of a first transfer unit described in the claims.

The intermediate node 134 is an MOS transistor which temporarily accumulates and holds electric charge in a channel. In the global shutter method, this intermediate node 134 is used as an analog memory. The gates of the transfer transistor 133 and the intermediate node 134 are driven collectively. However, threshold control is performed such that a potential of a channel of the transfer transistor 133 is shallower than that of the intermediate node 134 so that electric charge is transferred from the photodiode 131 to the intermediate node 134 without causing the electric charge to flow backward during the driving. Note that the intermediate node 134 is an example of an electric charge accumulation unit described in the claims.

The transfer transistor 135 transfers the electric charge from the intermediate node 134 to the detection node 136 under control of the row drive circuit 150. Note that the transfer transistor 135 is an example of a second transfer unit described in the claims.

The detection node 136 accumulates the electric charge from the transfer transistor 135 to generate a voltage according to the amount of the accumulated electric charge. A floating diffusion layer, for example, is used as the detection node 136. This voltage is applied to the gate of the amplifier transistor 138. Note that the detection node 136 is an example of a voltage generation unit described in the claims.

The reset transistor 137 draws out the electric charge accumulated in the detection node 136 to a power supply for initialization. The gate of the reset transistor 137 is connected to the row drive circuit 150, the drain thereof is connected to the power supply, and the source thereof is connected to the detection node 136. The row drive circuit 150 causes the electric charge to be transferred and drawn out from the photodiode 131 to the detection node 136 via the transfer transistors 133 and 135, and the intermediate node 134 with, for example, the reset transistor 137 switched on. Through this control, it is possible to set the channels of the photodiode 131 and the intermediate node 134 to a dark state together, i.e., to reset them to an initial state in which no signal charge is present.

The amplifier transistor 138 amplifies a voltage of a gate. The gate of the amplifier transistor 138 is connected to the detection node 136, the drain thereof is connected to the power supply, and the source thereof is connected to the selection transistor 139. The amplifier transistor 138 and the constant current circuit 110 form a source follower, and an electric signal of a voltage of the detection node 136 is output to a vertical signal line 129 with a gain of slightly less than 1. This electric signal is acquired by the detection circuit 160.

The selection transistor 139 outputs an electron signal under control of the row drive circuit 150. The gate of the selection transistor 139 is connected to the row drive circuit 150, the drain thereof is connected to the amplifier transistor 138, and the source thereof is connected to the vertical signal line 129. The row drive circuit 150 selects one row, turns all selection transistors 139 in the selected row on, and thereby causes an electric signal to be output to pixel circuits 130 in the row.

In addition, the constant current circuit 110 includes, for example, an MOS transistor 111. A predetermined voltage is applied to the gate of the MOS transistor, the drain thereof is connected to the vertical signal line 129, and source thereof is grounded. The constant current circuit 110 is connected to the pixel circuit 130 in a column via the vertical signal line 129.

Figure 3:
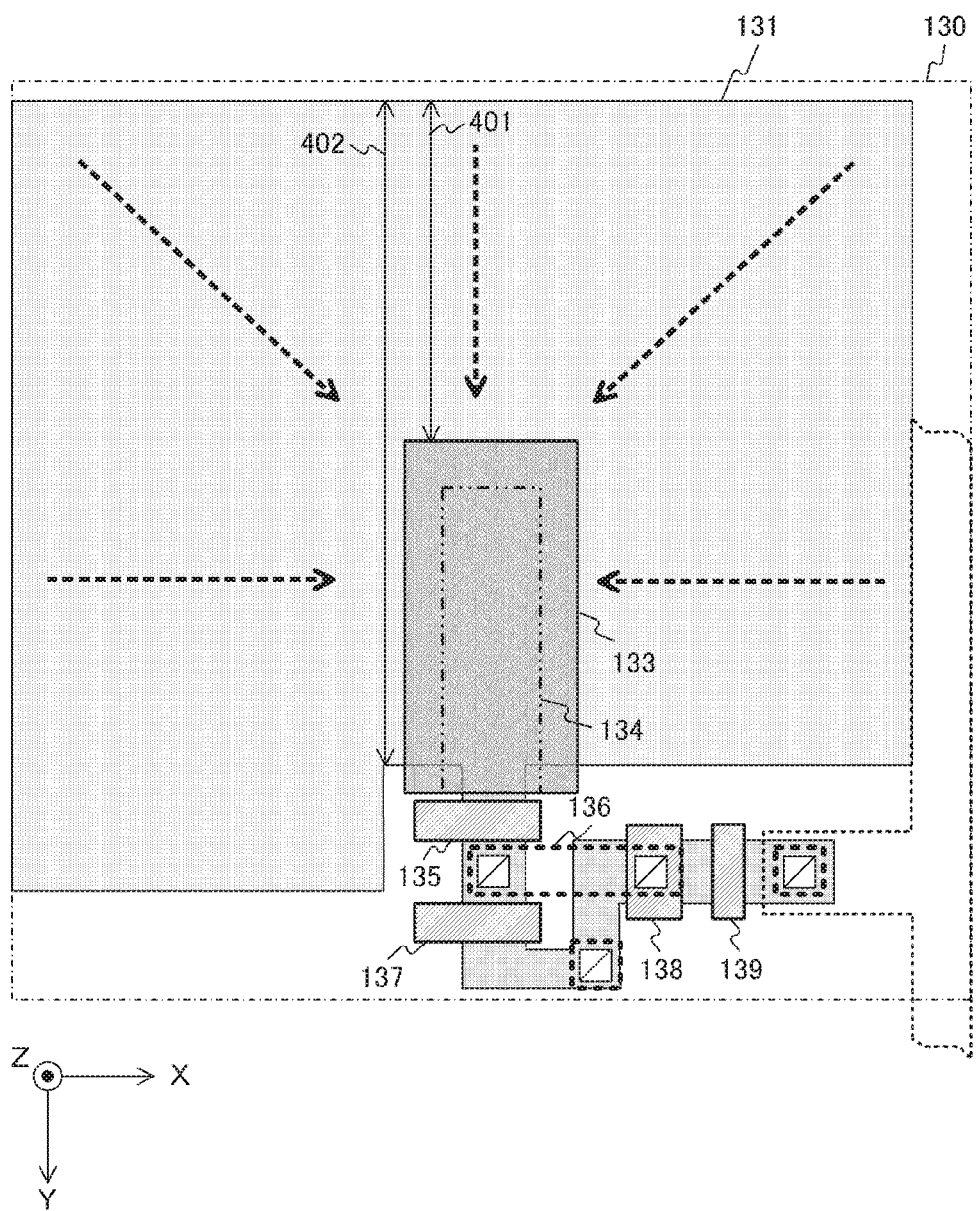
FIG. 3 is an example of a plan diagram of the pixel circuit according to the first embodiment.

FIG. 3 is an example of a plan diagram of the pixel circuit 130 according to the first embodiment. In the drawing, the portions with oblique lines indicate gate electrodes of transistors and the portions with dashed lines indicate metal wiring.

The photodiode 131 is formed between the outer circumference of the pixel circuit 130 and the transfer transistor 133 on a light receiving surface, i.e., an X-Y plane.

The transfer transistor 133 and the intermediate node 134 have a transfer gate and an accumulation gate which are integrally formed, these gates are formed of the same polysilicon layer as other gates, and are separated from the transfer transistor 135 by having a very narrow gap therebetween. Although the transfer transistor 133 and the intermediate node 134 are driven collectively as described above, for example, a threshold of the transfer transistor 133 is adjusted to be higher than a threshold voltage of the intermediate node 134 in an n-type MOS structure. Thus, electric charge of the photodiode 131 is transferred to a channel of the intermediate node 134 through application of a pulse to the gates of the transfer transistor 133 and the intermediate node 134.

Here, the photodiode 131 is disposed to surround the transfer transistor 133 and the intermediate node 134 in three directions. To be more specific, the transfer transistor 133 and the intermediate node 134 are formed in a rectangular area whose three sides are adjacent to the photodiode 131 on the light receiving surface. In addition, the photodiode 131 is formed between the outer circumference of a pixel area that is greater than the rectangular area and the three sides of the rectangular area on the light receiving surface. Note that the shape of an area in which the transfer transistor 133 and the intermediate node 134 are provided is not limited to a rectangular area as long as it is a polygon, and for example, may be a trapezoid.

Here, if only one side of the transfer transistor 133 and the intermediate node 134 is disposed to be adjacent to the photodiode 131, a movement distance of electric charge within the photodiode 131 is the same distance as a side 401 of the photodiode 131.

On the other hand, if the transistors are disposed such that the three sides are adjacent thereto as shown in FIG. 3, a movement distance 402 of electric charge within the photodiode 131 is shorter than the distance (401) when only one side is adjacent thereto. When 401 is half of 402, for example, even if the size of the photodiode 131 doubles, the movement distance of the electric charge does not change.

When a CMOS sensor is used in radiation photon counting or ultra-low illuminance imaging of fluorescent observation etc., fine pixels are unnecessary in most cases, and larger pixels are desirable to prevent accumulation of pixel noise. However, as pixels become larger, a movement distance of electric charge within the photodiode 131 becomes longer, and thus transfer efficiency to the detection node 136 deteriorates. As a result, conversion efficiency of photoelectric conversion deteriorates. With the disposition of FIG. 3, it is possible to prevent a movement distance of electric charge from becoming longer when a size of each pixel increases. Thus, it is possible to easily make the size of each pixel increase while conversion efficiency is maintained.

In addition, the dashed-lined arrows of FIG. 3 indicate a potential gradient in the photodiode 131, and a concentration of impurities is adjusted so that a potential become deeper toward the intermediate node 134 (analog memory) from the three directions. Accordingly, a transfer of slight electric charge from the outer circumference of the photodiode 131 to the intermediate node 134 is smoothly performed.

Note that a crack may meet in a part of the layout in which the photodiode 131 surrounds the intermediate node 134. In other words, the transfer transistor 133 and the intermediate node 134 may be disposed so that two sides, rather than three sides, are adjacent to the photodiode. However, it is desirable for the intermediate node 134 to be in contact with the photodiode 131 in most of three directions via the transfer transistor 133.

Furthermore, it is possible to set the layout of the detection node 136 and its following components to have a high degree of freedom by interleaving the intermediate node 134, and to minimize parasitic capacitance of the detection node 136 by using a fine structure substantially similar to one of the related art.

The reset transistor 137 and the amplifier transistor 138 receive supply of, for example, 3V from the power supply.

An S/N ratio of a pixel output with respect to one electron signal generated from one photon is, for example, determined substantially by the amplitude for one electron (parasitic capacitance of one electronic charge) of the detection node 136 and random noise of the amplifier transistor 138 in gate conversion. While the latter is determined based on a unique design of the amplifier transistor 138, the former is determined based on a parasitic capacitance of the detection node 136. Thus, it is desirable to minimize the parasitic capacitance of the detection node 136 as far as possible.

Figure 4:
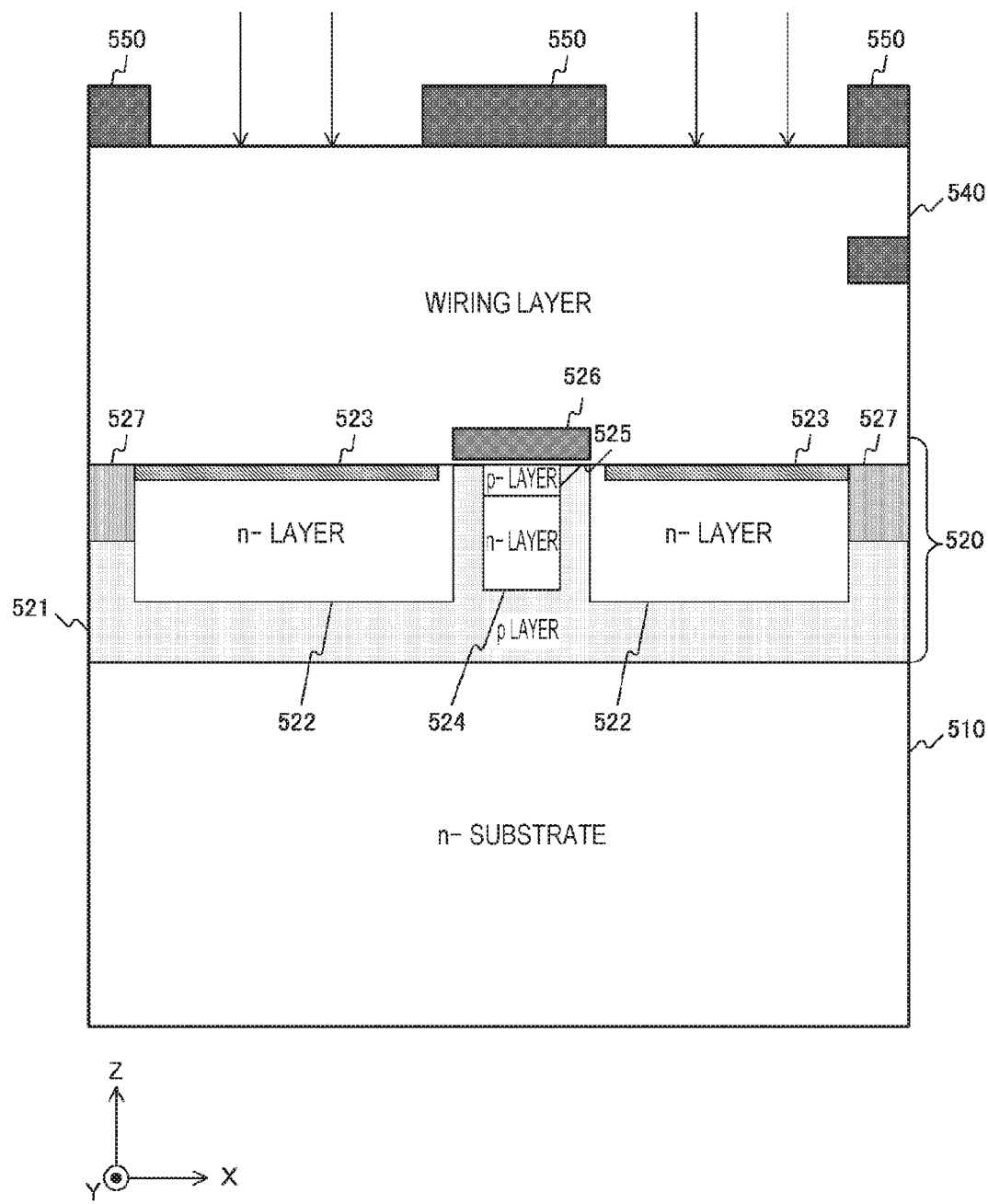
FIG. 4 is an example of a cross-sectional diagram of the pixel circuit according to the first embodiment seen in an X direction.

FIG. 4 is an example of a cross-sectional diagram of the pixel circuit 130 according to the first embodiment seen in the X direction. This pixel circuit 130 includes an n⁻ substrate 510, a light receiving unit 520, a wiring layer 540, and a light shielding layer 550. The light receiving unit 520 includes a p layer 521, an n⁻ layer 522, a p⁺ layer 523, an n⁻ layer 524, a p⁻ layer 525, a gate electrode 526, and an element isolation region 527.

The n⁻ substrate 510 is a substrate composed of an n-type semiconductor having a relatively low impurity concentration. With the side on which light is incident set as an upper side, the p layer 521 composed of a p-type semiconductor is formed on the n⁻ substrate 510. The n⁻ layer 522 composed of a semiconductor having a relatively low impurity concentration is formed in the p layer 521, and the n⁻ layer 524 is formed in a region surrounded by the n⁻ layer 522. The p⁻ layer 525 composed of a p-type semiconductor having a relatively low impurity concentration is formed on the n⁻ layer 524. The n⁻ layer 524 and the p⁻ layer 525 constitute an embedded channel. In this case, the channel is formed in the n⁻ layer 524 that is slightly away from a substrate surface of the light receiving unit 520 on the wiring layer 540 side, and signal charge is accumulated in the channel. By embedding the channel in this way, loss of signal charge caused by a recombination center of the substrate surface can be prevented. The p⁺ layer 523 composed of a p-type semiconductor having a relatively high impurity concentration is formed on the n⁻ layer 522, and the gate electrode 526 is formed above the p layer 521. This gate electrode 526 is formed of, for example, an n-type polysilicon having a relatively high impurity concentration. In addition, the element isolation region 527 is formed at the end of the p layer 521. This element isolation region 527 is formed of an oxide film, a p⁺ diffusion layer, or the like.

The photodiode 131 is formed of the p⁺ layer 523 and the n⁻ layer 522. In addition, the transfer transistor 133 is formed of the n⁻ layer 522, the p layer 521, the p⁻ layer 524, and the gate electrode 525. The intermediate node 134 is formed of the p layer 521, the p⁻ layer 524, and the gate electrode 525.

In addition, the wiring layer 540 is provided on the light receiving unit 520. Furthermore, the light shielding layer 550 that shields light is provided at a position on the wiring layer 540 corresponding to the intermediate node 134.

Note that, although light is radiated onto the wiring layer 540 side, a configuration in which light is radiated onto one of the two surfaces of the light receiving unit 520 on which the wiring layer 540 is not provided (i.e., the rear surface) is possible. Such a CMOS sensor is called a rear surface irradiation type CMOS sensor.

Figure 5:
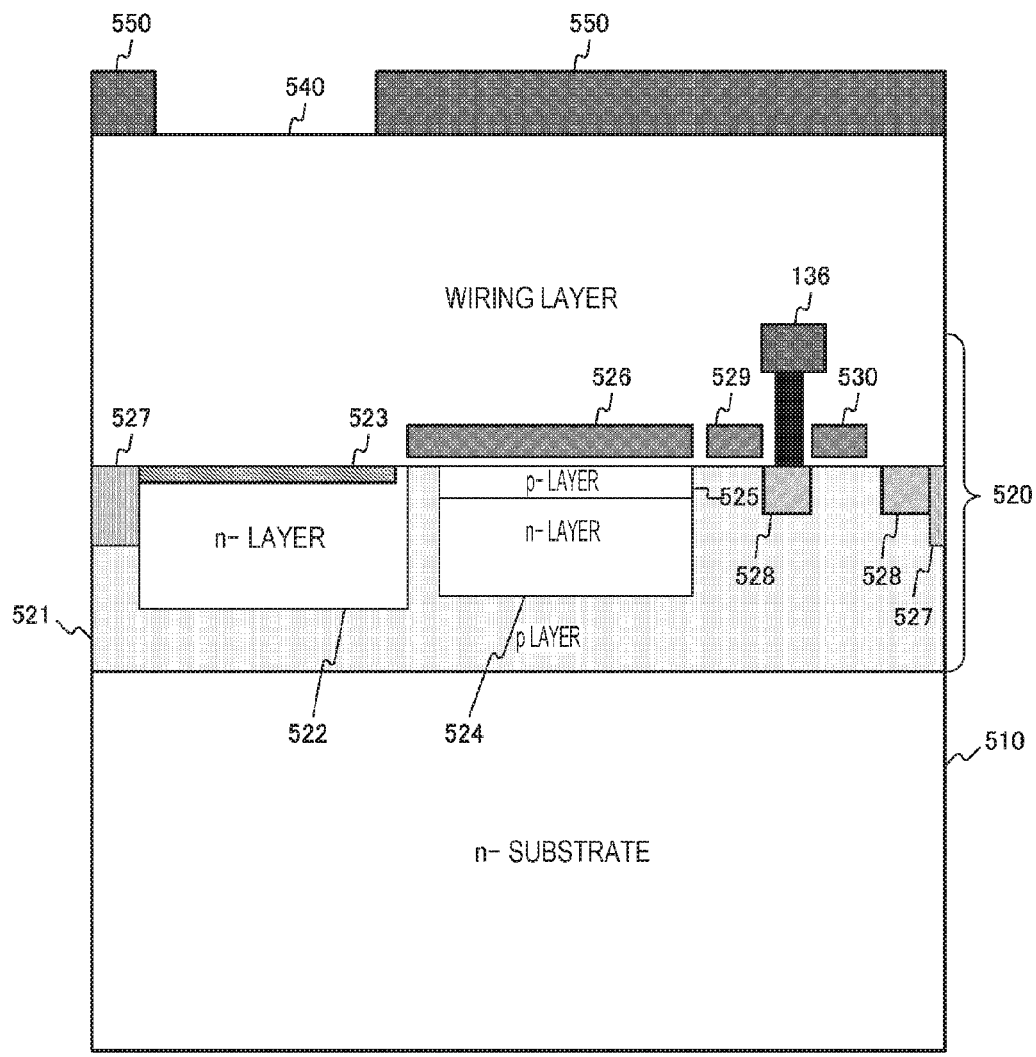
FIG. 5 is an example of a cross-sectional diagram of the pixel circuit according to the first embodiment seen in a Y direction.

FIG. 5 is an example of a cross-sectional diagram of the pixel circuit 130 according to the first embodiment seen in the Y direction. In this cross-section, the light receiving unit 520 further includes n⁺ diffusion layers 528, gate electrodes 529 and 530, and the detection node 136.

Two n⁺ diffusion layers 528 are formed in an upper part of the p layer 521, adjacent to the element isolation region 527, and the gate electrode 530 is provided between the diffusion layers above the p layer 521. In addition, the gate electrode 529 is provided between one n⁺ diffusion layer 528 and the p⁻ layer 524 above the p layer 521. Furthermore, the detection node 136 is connected to the n⁺ diffusion layer 528 between the gate electrodes 529 and 530.

The transfer transistor 135 is constituted by the p⁻ layer 524, the p layer 521, the n⁺ diffusion layer 528, and the gate electrode 529. In addition, the reset transistor 137 is constituted by the two n⁺ diffusion layers 528, the p layer 521, and the gate electrode 530.

FIG. 6 shows potential diagrams for describing a transfer of electric charge to the intermediate node according to the first embodiment, a of the drawings is an example of a potential diagram before the transfer to the intermediate node 134 (analog memory). Electric charge is accumulated in the node 132 of the photodiode 131. In addition, both the intermediate node 134 and the detection node 136 have been reset to be in a floating state.

b of FIG. 6 is an example of a potential diagram after the transfer to the intermediate node 134. When an exposure period ends, the row drive circuit 150 controls the transfer transistor 133 and the intermediate node 134 to be in an on-state. Through this control, signal charge is transferred to the channel of the intermediate node 134.

FIG. 7 is a diagram for describing a transfer of electric charge to the detection node 136 according to the first embodiment. a of the drawing is an example of a potential diagram before the transfer to the detection node 136. When the transfer to the intermediate node 134 is completed, the row drive circuit 150 controls both the transfer transistor 133 and the intermediate node 134 to be in an off-state. Due to a potential difference caused between the transfer transistor 133 and the intermediate node 134 in this state, it is possible to prevent the signal charge from flowing backward to the node 132. Then, a reset signal is read.

b of FIG. 7 is an example of a potential diagram after the transfer to the detection node 136. When the reset signal is read, the row drive circuit 150 controls the transfer transistor 135 to be in an on-state. Through this control, the electric charge of the intermediate node is transferred to the detection node 136.

Note that, when exposure is performed in a rolling shutter scheme, the transfer transistor 135 may be controlled to be in an on-state immediately after the end of the exposure (b of FIG. 6). Then, by setting the transfer transistor 133 and the intermediate node 134 to be in an off-state, the accumulated electric charge is transferred to the detection node 136 without exception. At this moment, the intermediate node 134 does not have to hold the electric charge, but functions as an intermediate collection route.

Example of Operation of Pixel Circuit

Figure 8:
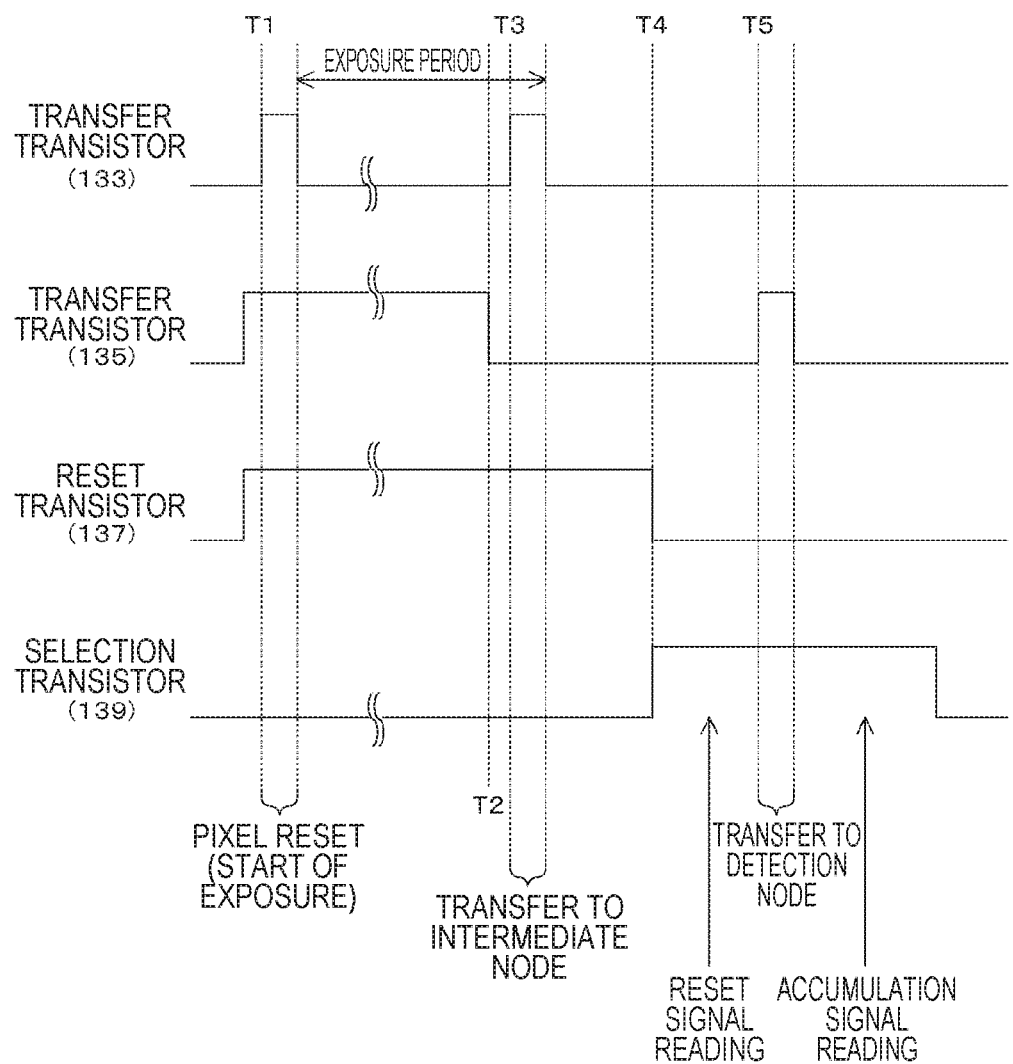
FIG. 8 is a timing chart showing an example of an operation of the pixel circuit according to the first embodiment.

FIG. 8 is a timing chart showing an example of an operation of the pixel circuit 130 according to the first embodiment. The row drive circuit 150 resets the photodiode 131 at a timing T1 before exposure. This reset is referred to as a photodiode (PD) reset. The row drive circuit 150 applies a pulse to the transfer transistor 133 at the timing T1, with the transfer transistor 135 and the reset transistor 137 set to be in an on-state. Through this control, the entire accumulated electric charge of the photodiode is drawn out to the power supply, and exposure is started.

Then, the row drive circuit 150 controls the transfer transistor 135 to be in an off-state at a timing T2 before an end of the exposure, and sets the intermediate node 134 to be in a floating state.

At a timing T3 thereafter, the row drive circuit 150 applies a pulse to the transfer transistor 133 again, to cause the signal charge accumulated in the photodiode 131 to be transferred to and held in the channel of the intermediate node 134. At this point, the accumulation of the electric charge in the photodiode 131, i.e., the exposure is ended. The exposure period corresponds to the period from the end of the pulse application at the timing T1 to the end of the pulse application at the timing T3. This exposure is performed, for example, in all pixels all at once. In this case, global shutter is realized. Note that the rolling shutter method in which exposure is performed sequentially in rows may be used.

At a timing T4 after the end of the exposure, the row drive circuit 150 controls the reset transistor 137 to be in an off-state and the selection transistor 139 to be in an on-state. Accordingly, the detection node 136 is set to be in a floating state. This control will be referred to hereinafter as floating diffusion (FD) reset.

The detection circuit 160 reads an electric signal output by the pixel circuit 130 as a reset signal between the end of the FD reset and a timing T5.

Then, the row drive circuit 150 applies a pulse to the transfer transistor 135 at the timing T5. Through this control, the accumulated electric charge held in the intermediate node 134 is transferred to the detection node 136.

The detection circuit 160 reads the electric signal output from the pixel circuit 130 as an accumulation signal after the transfer of the electric charge to the detection node 136. The detection circuit 160 determines an amount of incident photons by comparing the reset signal and the accumulation signal. Output noise components derived from kTC noise or the like generated at the time of FD reset are offset by setting the difference between the accumulation signal and the reset signal to be a net accumulation signal.

The reset transistor 137 and the transfer transistor 135 are set to be in an on-state during the exposure period here, and the reason for this is to absorb extra electric charge generated in components other than the photodiode 131 and thereby to present noise from being generated. Without such concern, the reset transistor 137 and the transfer transistor 135 may be off after the PD reset. On the other hand, the selection transistor 139 is controlled to be in an off-state during the exposure period to allow access of other pixel circuits 130 connected to the vertical signal line 129.

As described above, since electric charge is held in the rectangular area of which a plurality of sides thereof are adjacent to the photodiode 131 according to the first embodiment, a movement distance of electric charge within the photodiode 131 can be shortened. Accordingly, the size of each pixel can be greater than when such an area is not provided.

2. Second Embodiment

In the above-described first embodiment, the intermediate node 134 that holds electric charge is shielded from light, but it may be used as an MOS-type photoelectric conversion element without being shielded from light. In this case, it is not possible to perform control of the global shutter method, but an aperture ratio can increase. Here, an aperture ratio means a ratio of an area in which photoelectric conversion is performed to an area of the light receiving surface of the pixel circuit 130. In addition, if the intermediate node 134 performs photoelectric conversion, the size of each pixel can increase with no reduction in the aperture ratio. That is, an image sensor 100 according to a second embodiment is different from that of the first embodiment in that an intermediate node performs photoelectric conversion.

Figure 9:
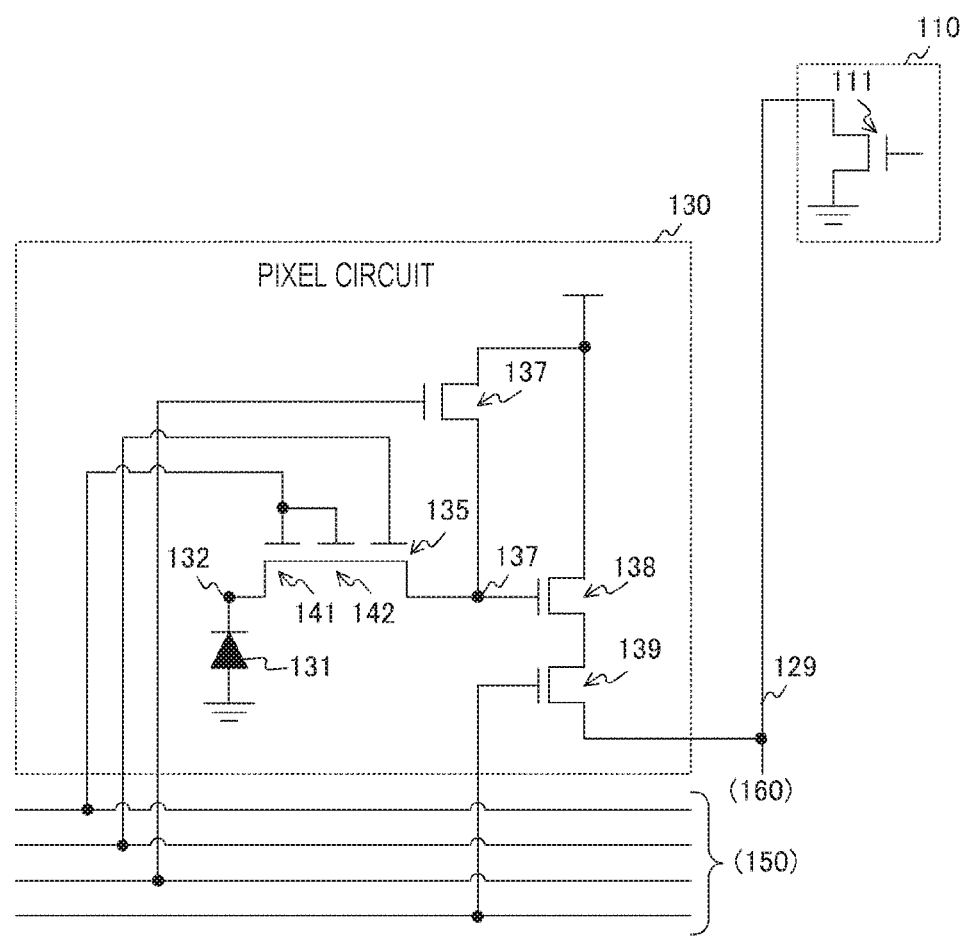
FIG. 9 is a circuit diagram showing an example of a pixel circuit according to a second embodiment.

FIG. 9 is a circuit diagram showing an example of a pixel circuit 130 according to the second embodiment. The pixel circuit 130 according to the second embodiment is different from that of the first embodiment in that a transfer transistor 141 and an intermediate node 142 are included, in place of the transfer transistor 133 and the intermediate node 134. The transfer transistor 141 and the intermediate node 142 have a similar configuration to the transfer transistor 133 and the intermediate node 134 of the first embodiment except that they are not shielded from light.

Figure 10:
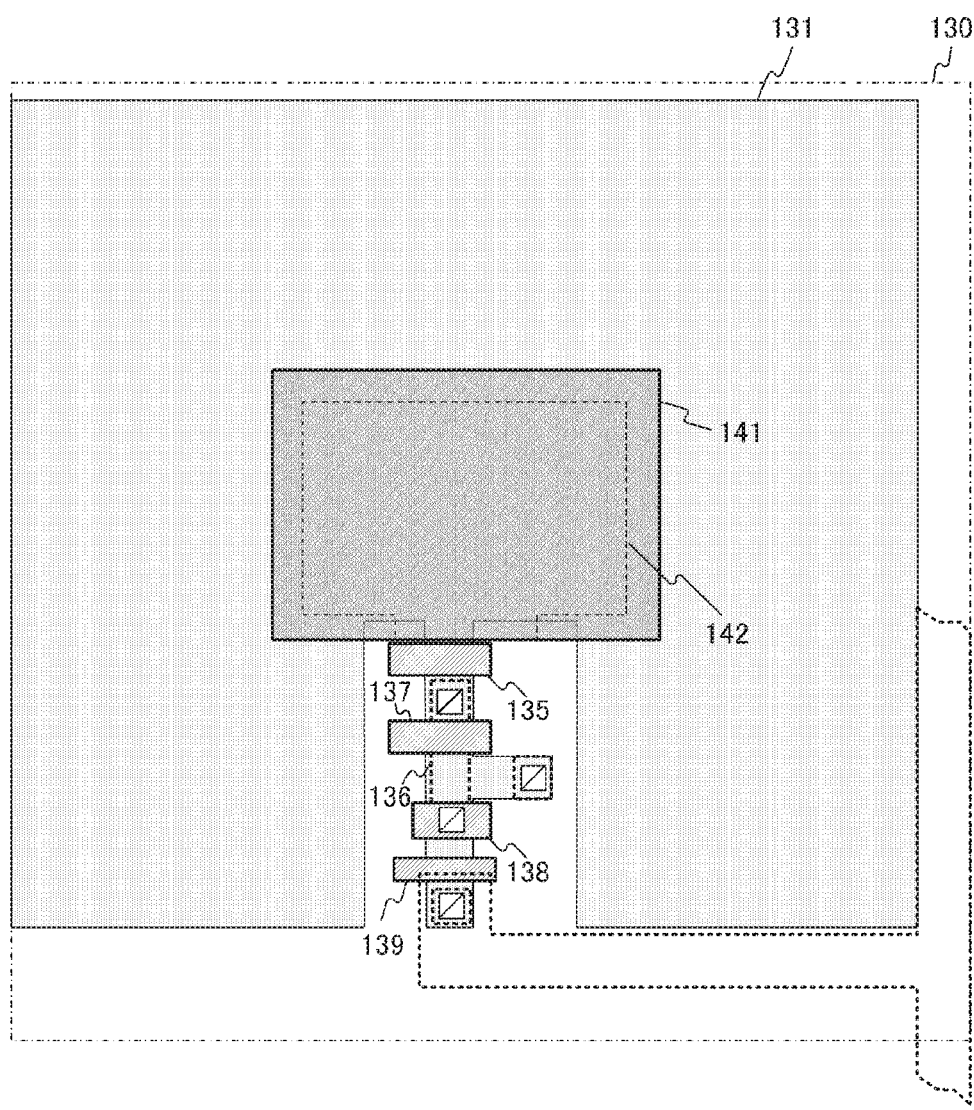
FIG. 10 is an example of a plan diagram of the pixel circuit according to the second embodiment.

FIG. 10 is an example of a plan diagram of the pixel circuit 130 according to the second embodiment. In the drawing, the portions with oblique lines indicate gate electrodes of transistors and the portions with dashed lines indicate metal wiring. The pixel circuit 130 according to the second embodiment includes the transfer transistor 141 and the intermediate node 142, in place of the transfer transistor 133 and the intermediate node 134. As illustrated in the drawing, an area of the transfer transistor 141 and the intermediate node 142 can be wider than that of the first embodiment. This is because, as a result that light is radiated to the intermediate node 142 as well, an aperture ratio is not lowered even if the area of the intermediate node 142 is widened as described above.

Figure 11:
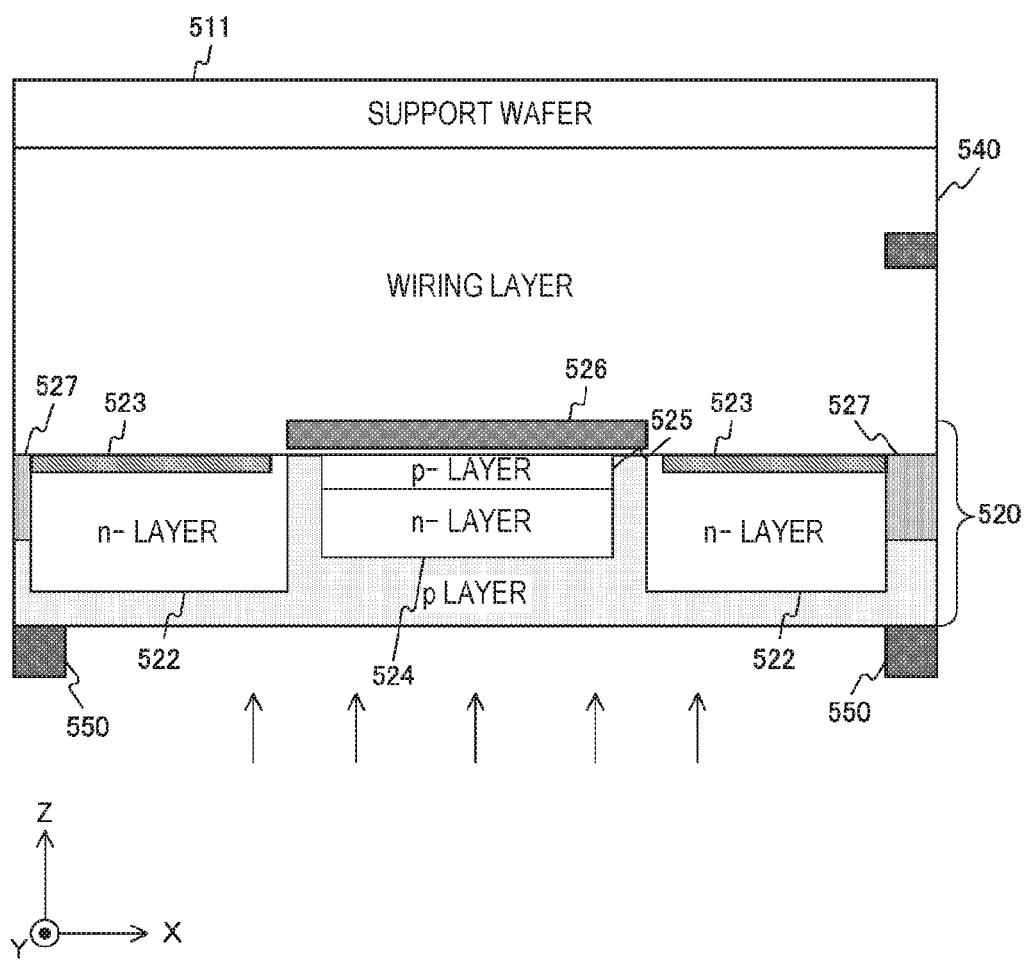
FIG. 11 is an example of a cross-sectional diagram of the pixel circuit according to the second embodiment seen in an X direction.

FIG. 11 is an example of a cross-sectional diagram of the pixel circuit 130 according to the second embodiment seen in the X direction. The pixel circuit 130 of the second embodiment is provided with a support wafer 511 in place of the n⁻ substrate 510. In addition, a wiring layer 540 is provided between a light receiving unit 520 and the support wafer 511. Furthermore, light is radiated onto one of the two surfaces of the light receiving unit 520 on which the wiring layer 540 is not provided (the rear surface). In addition, a gate electrode 526 is provided on a surface of the light receiving unit 520 on the wiring layer 540 side, and no light shielding unit is provided at the place corresponding to the transfer transistor 141 and the intermediate node 142 on the rear surface. Thus, the intermediate node 142 can perform photoelectric conversion.

Note that the image sensor 100 may have a configuration in which light is radiated from the wiring layer 540 side as in the first embodiment, without employing a rear surface irradiation configuration. However, if light is radiated from the wiring layer 540 side, there is concern of an aperture ratio being lowered due to the gate electrode 526 and wiring, and therefore, a rear surface irradiation type is desirable.

Figure 12:
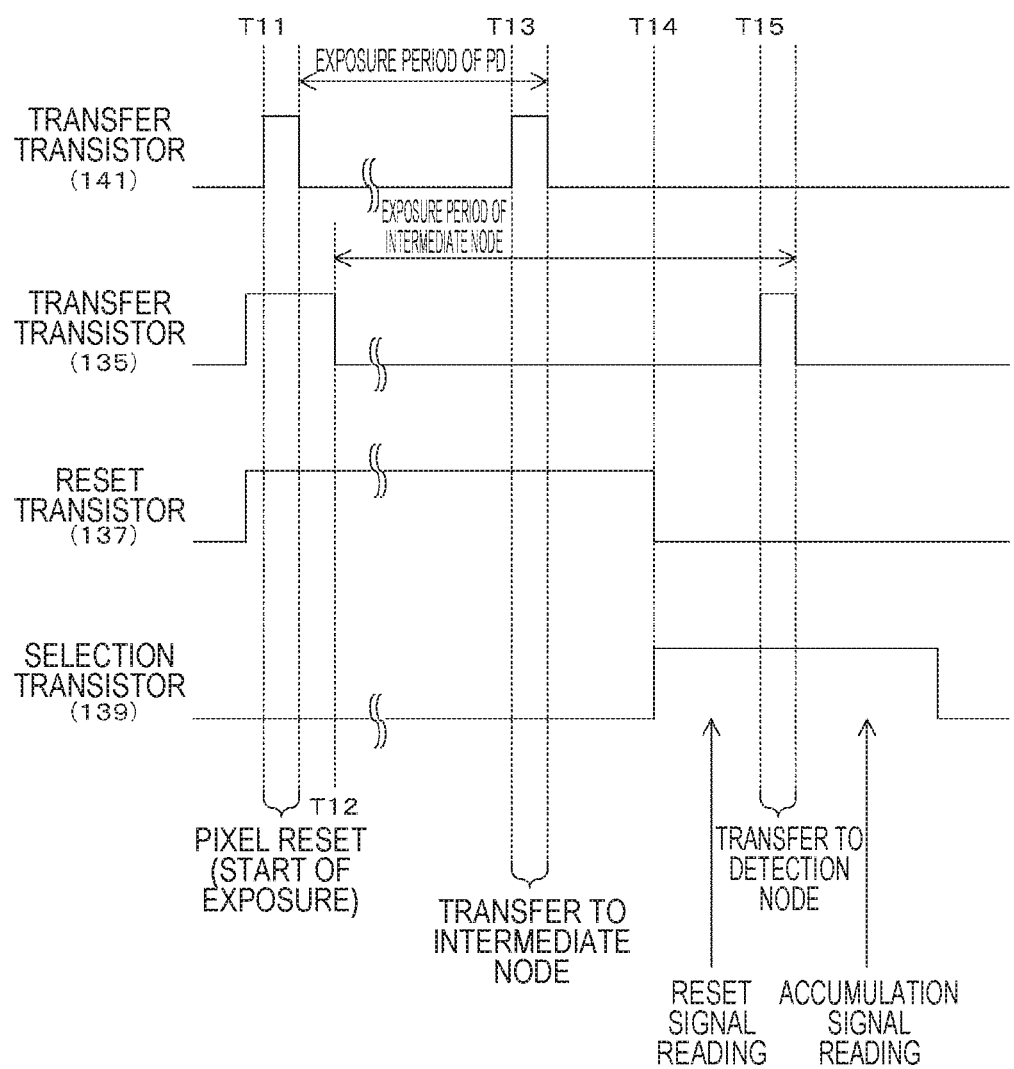
FIG. 12 is a timing chart showing an example of an operation of the pixel circuit according to the second embodiment.

FIG. 12 is a timing chart showing an example of an operation of the pixel circuit 130 according to the second embodiment.

A row drive circuit 150 applies a pulse to the transfer transistor 141 with a transfer transistor 135 and a reset transistor 137 set to be in an on-state at a timing T11 before exposure. Through this control, an entire accumulated electric charge of a photodiode 131 is drawn out and exposure is started.

Then, the row drive circuit 150 controls the transfer transistor 135 to be in an off-state at a timing T12 after a start of exposure of the photodiode 131. Through this control, electric charge photoelectrically converted in the intermediate node 142 starts to be accumulated.

At a timing T13 thereafter, the row drive circuit 150 applies a pulse again to the transfer transistor 133 to cause signal charge accumulated in the photodiode 131 to be transferred to and held in the intermediate node 142. At this point, accumulation of electric charge in the photodiode 131, i.e., the exposure is ended. The exposure period of the photodiode 131 corresponds to the period from the end of the pulse application at the timing T11 to the end of the pulse application at the timing T13. The electric charge generated by the photodiode 131 is added to the electric charge accumulated in the intermediate node 142, and temporarily held therein.

Furthermore, at a timing T14 after the end of the exposure, the row drive circuit 150 controls the reset transistor 137 to be in an off-state, and a selection transistor 139 to be in an on-state. Accordingly, FD reset is performed. A detection circuit 160 reads an electric signal output from pixel circuit 130 as a reset signal for the period after the end of the FD reset to a timing T15.

Then, the row drive circuit 150 applies a pulse to the transfer transistor 135 at a timing T15. Through this control, the accumulated electric charge held in the intermediate node 142 is transferred to a detection node 136. The exposure period of the intermediate node 142 corresponds to the period from the timing T12 to the end of the pulse application of the timing T15.

After the transfer of the electric charge to the detection node 136, the detection circuit 160 reads the electric signal output from the pixel circuit 130 as an accumulation signal.

In the second embodiment, the start and the end of the exposure of the photodiode 131 and the intermediate node 142 are executed in order of rows, and thus the exposure is performed in the so-called rolling shutter method. This is because the intermediate node 142 is not shielded from light, and electric charge is not held in the intermediate node 142 after the end of the exposure.

As described above, according to the second embodiment of the present technology, light is also radiated to the rectangular area whose a plurality of sides are adjacent to the photodiode 131 and photoelectric conversion is performed therein, and therefore an aperture ratio can improve.

3. Third Embodiment

The above-described second embodiment has only one intermediate node, however, a plurality of intermediate nodes may be provided. If a size of an intermediate node increases according to an increase of the size of each pixel, a movement distance of electric charge within the intermediate node is lengthened, however, if another intermediate node is provided in the intermediate node, movement distances in the respective intermediate nodes can be shortened. In other words, an image sensor 100 of a third embodiment is different from that of the second embodiment in that a plurality of intermediate nodes are provided.

Figure 13:
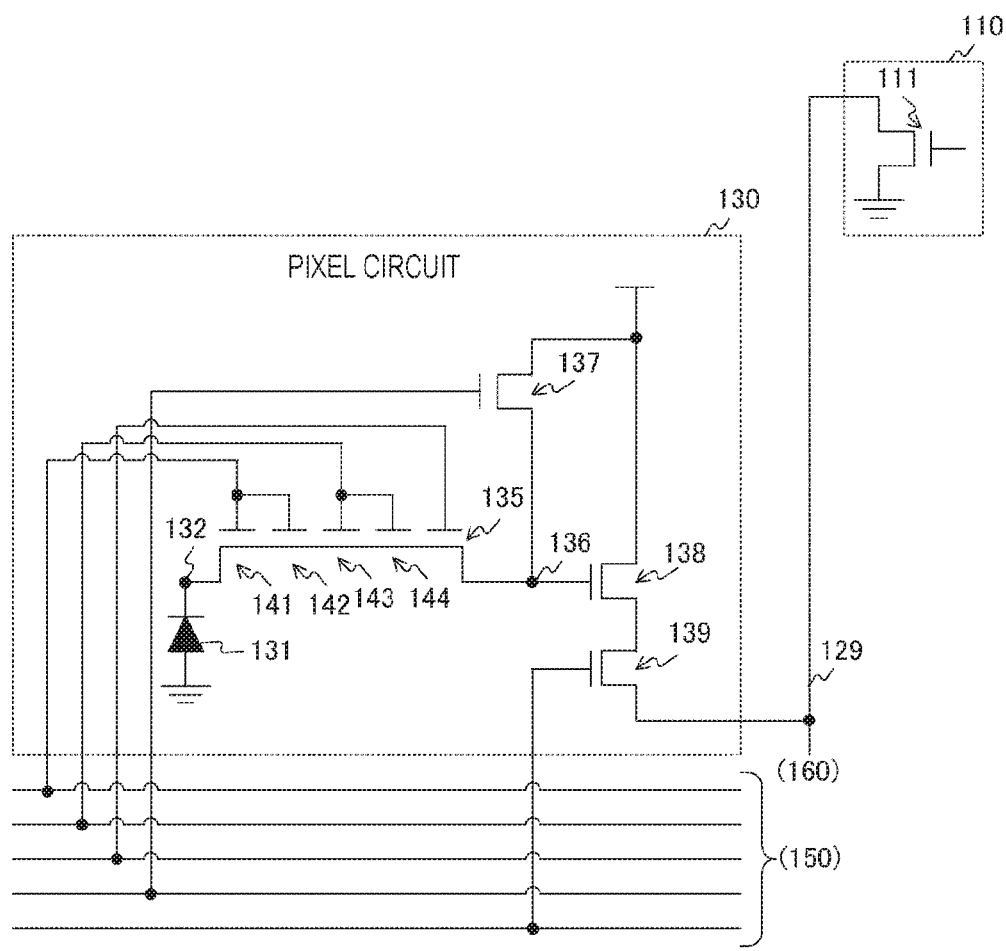
FIG. 13 is a circuit diagram showing an example of a pixel circuit according to a third embodiment.

FIG. 13 is a circuit diagram showing an example of a pixel circuit 130 according to a third embodiment. The pixel circuit 130 according to the third embodiment is different from that of the second embodiment in that a transfer transistor 143 and an intermediate node 144 are further included.

The transfer transistor 143 and the intermediate node 144 are integrally formed with a transfer transistor 141, an intermediate node 142, and a transfer transistor 135 through a series gate to constitute an MOS transistor. These transistors have an integrated series FET structure in which no conductivity type diffusion layer is interposed between their channels. In addition, the gate of the transfer transistor 143 is connected to a row drive circuit 150 and the intermediate node 144.

The transfer transistor 141 transfers electric charge of a photodiode 131 to the intermediate node 142, and adds the electric charge to electric charge accumulated in the intermediate node 142 through exposure, as in the second embodiment. Next, the transfer transistor 143 transfers the electric charge of the intermediate node 142 to the intermediate node 144, and the electric charge is accumulated for a while. Then, the transfer transistor 135 transfers the electric charge of the intermediate node 144 to a detection node 136.

Note that the transfer transistor 141 is an example of the first transfer transistor described in the claims, and the intermediate node 142 is an example of the first intermediate node described in the claims. In addition, the transfer transistor 143 is an example of the second transfer transistor described in the claims, and the intermediate node 144 is an example of the second intermediate node described in the claims.

The gates of the transfer transistor 143 and the intermediate node 144 are driven collectively. At this time, threshold control is performed such that a potential of the transfer transistor 143 is shallower than that of the intermediate node 144 so that the electric charge is transferred from the intermediate node 142 to the intermediate node 144 without causing it to flow backward. As described above in the second embodiment, threshold voltages of the transfer transistor 141 and the intermediate node 142 are controlled in a similar manner. In other words, the transfer from the photodiode 131 to the intermediate node 144 corresponds to a biphasic charge coupled device (CCD) transfer.

Note that, although the photodiode 131 is provided as a photoelectric conversion element, an MOS capacitor like the intermediate node 142 may be provided instead.

In addition, although one of the intermediate nodes 142 and 144 may be used as a photoelectric conversion element, both nodes may be used as photoelectric conversion elements. In this case, the global shutter method is not used. In addition, a configuration in which both nodes are shielded from light may be employed as in the first embodiment. However, an aperture ratio decreases if both the intermediate nodes 142 and 144 are shielded from light, and thus it is desirable to use at least one of the nodes as a photoelectric conversion element without being shielded from light.

Figure 14:
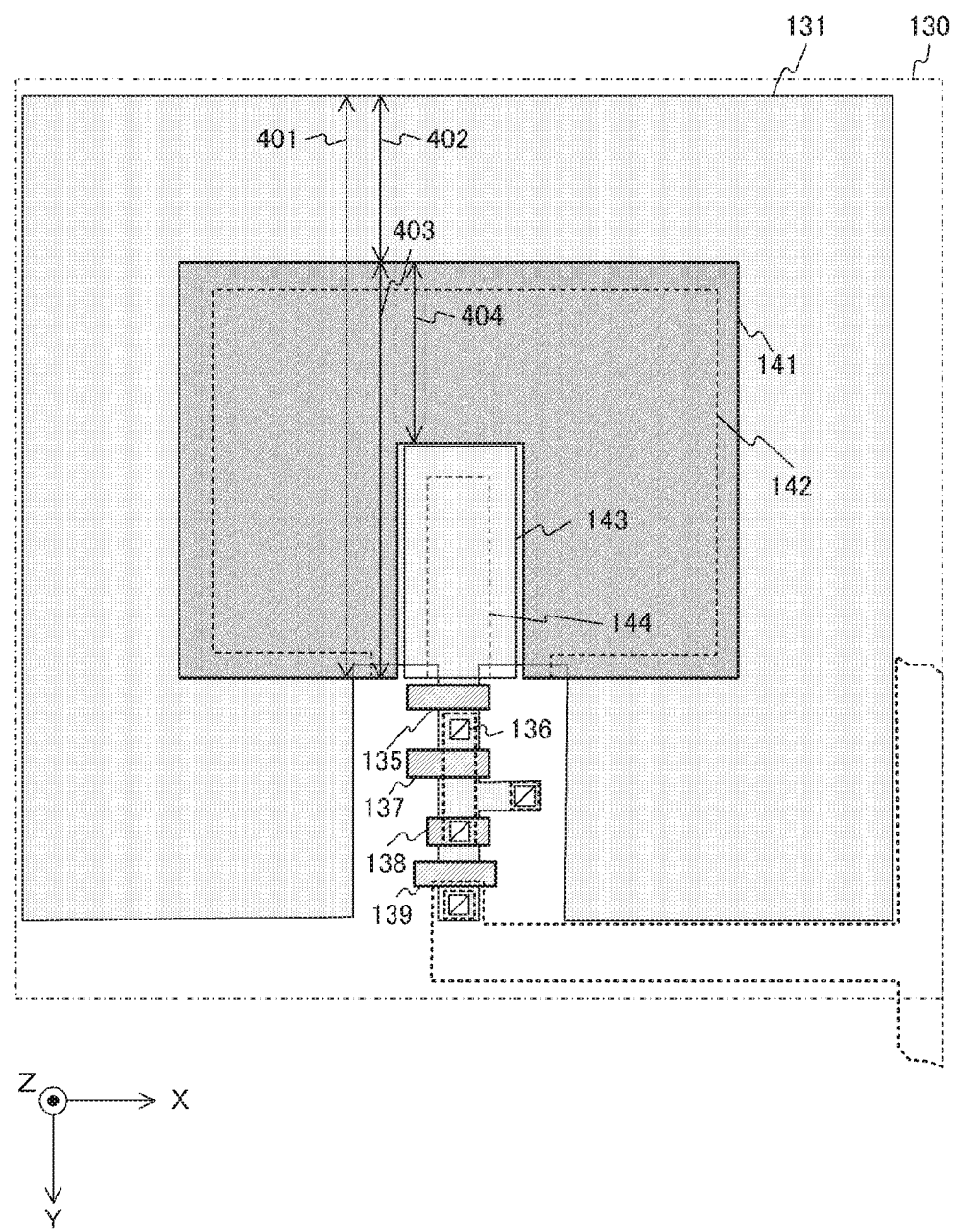
FIG. 14 is an example of a plan diagram of the pixel circuit according to the third embodiment.

FIG. 14 is an example of a plan diagram of the pixel circuit 130 according to the third embodiment. In the drawing, the portions with oblique lines indicate gate electrodes of transistors and the portions with dashed lines indicate metal wiring.

The transfer transistor 143 and the intermediate node 144 are formed in a rectangular area on a light receiving surface, and the transfer transistor 141 and the intermediate node 142 are formed between three sides of the rectangular area and the outer circumference of a larger rectangular area than the foregoing rectangular area. In addition, the photodiode 131 is formed between three sides of the larger rectangular area and the outer circumference of a pixel area.

The transfer transistor 141 and the intermediate node 142 are integrally formed. In addition, the gates of both the transfer transistor 141 and the intermediate node 142 are formed of the same polysilicon layer as the gate of the transfer transistor 143 or the intermediate node 144, and are separated from the transfer transistor 143 by a very narrow gap. Although the transfer transistor 141 and the intermediate node 142 are controlled collectively, in an n-type MOS structure, for example, a threshold of the transfer transistor 141 is adjusted to be shallower than that of the intermediate node 142. Electric charge of the photodiode 131 is transferred to the intermediate node 142 through application of a pulse to the transfer transistor 141 and the intermediate node 142.

A configuration of the transfer transistor 143 and the intermediate node 144 is similar to that of the transfer transistor 141 and the intermediate node 142. The electric charge of the intermediate node 142 is transferred to the intermediate node 144 through pulse application to the transfer transistor 143 and the intermediate node 144. That is, the transfer between them corresponds to a CCD transfer.

Here, the photodiode 131 is disposed to surround the transfer transistor 141 and the intermediate node 142 in three directions. In more detail, the transfer transistor 141 and the intermediate node 142 are formed in a rectangular area whose three sides are adjacent to the photodiode 131. In this disposition, a movement distance 402 of the electric charge within the photodiode 131 is shorter than a distance 401 when only one side thereof is adjacent to the photodiode.

In addition, the intermediate node 142 that doubles as an MOS-type photoelectric conversion element is disposed to surround the transfer transistor 143 and the intermediate node 144 in three directions. In more detail, the transfer transistor 143 and the intermediate node 144 are formed in a rectangular area whose three sides are adjacent to the intermediate node 142. In this disposition, a movement distance 404 of electric charge within the intermediate node 142 is shorter than a distance 403 according to the second embodiment.

During reading, a two-stage transfer in which the electric charge is transferred from the photodiode 131 to the intermediate node 142, and then from the intermediate node 142 to the intermediate node 144 is performed. In each stage of the transfer, a movement distance of the electric charge can be suppressed to be a certain length or shorter due to the disposition of FIG. 14. Thus, the electric charge is smoothly transferred.

Since the intermediate node 142 functions as a photoelectric conversion element along with the photodiode 131 in the third embodiment, an aperture ratio of the pixel circuit 130 is very high. Note that the photodiode 131 can also be formed to surround constitutions similar to the intermediate node 142. Accordingly, the size of each pixel can be increased further without lowering the aperture ratio.

Note that, although the integrated series transistor structures are formed by performing a process of separating the same polysilicon gate layer with a narrow gap in the examples described so far, the transistors may be formed in a stacked gate structure in which the transistors are implemented by general CCD devices.

Figure 15:
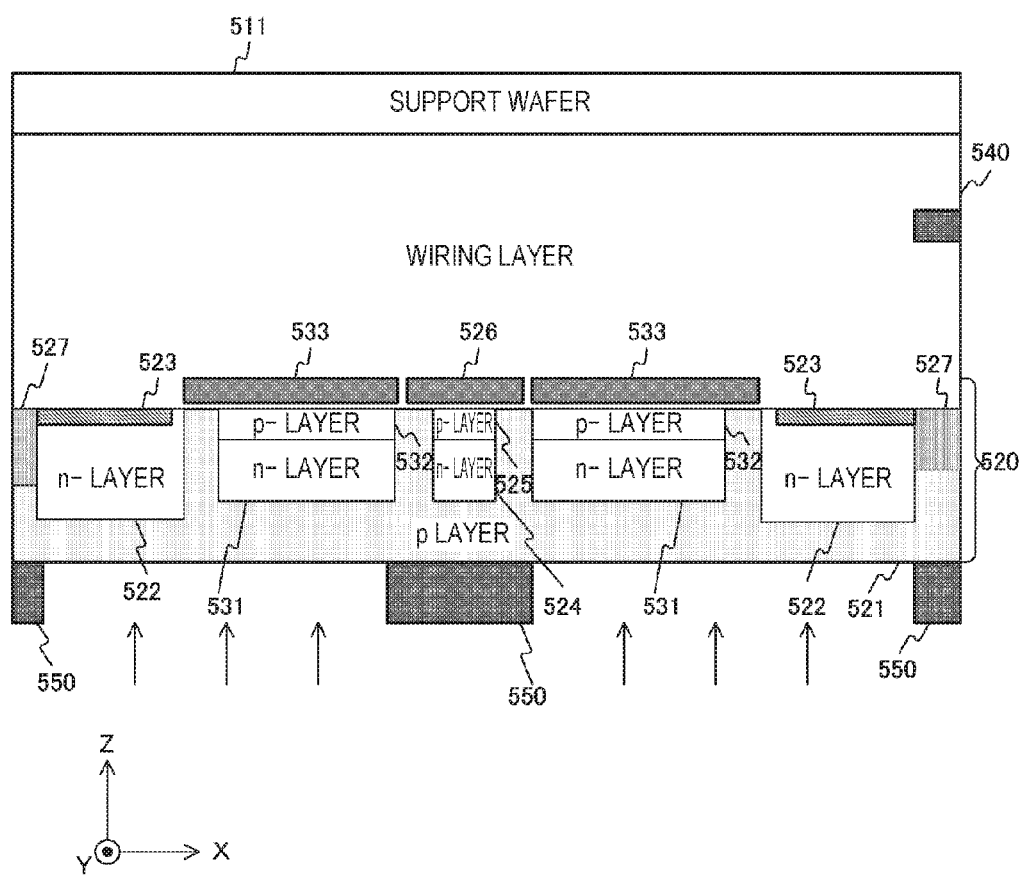
FIG. 15 is an example of a cross-sectional diagram of the pixel circuit according to the third embodiment seen in an X direction.

FIG. 15 is an example of a cross-sectional diagram of the pixel circuit 130 according to the third embodiment seen in the X direction. A configuration of the pixel circuit 130 according to the third embodiment is similar to the second embodiment except that a light receiving unit 520 further includes an n⁻ layer 531, a p⁻ layer 532, and a gate electrode 533.

The n⁻ layer 531 is inserted between an n⁻ layer 522 and a p⁻ layer 524 on a p layer 521. The p⁻ layer 532 is formed on the n⁻ layer 531, and the gate electrode 533 is formed on the p⁻ layer 532. The n⁻ layer 522, the p layer 521, the n⁻ layer 531, the p⁻ layer 532, and the gate electrode 533 form the transfer transistor 141. The p layer 521, the p⁻ layer 532, and the gate electrode 533 form the intermediate node 142. In addition, the n⁻ layer 524, a p⁻ layer 525, the p layer 521, the n⁻ layer 531, the p⁻ layer 532, and the gate electrode 533 form the transfer transistor 143. The p layer 521, the n⁻ layer 524, the p⁻ layer 525 and a gate electrode 526 form the intermediate node 144.

Figure 16:
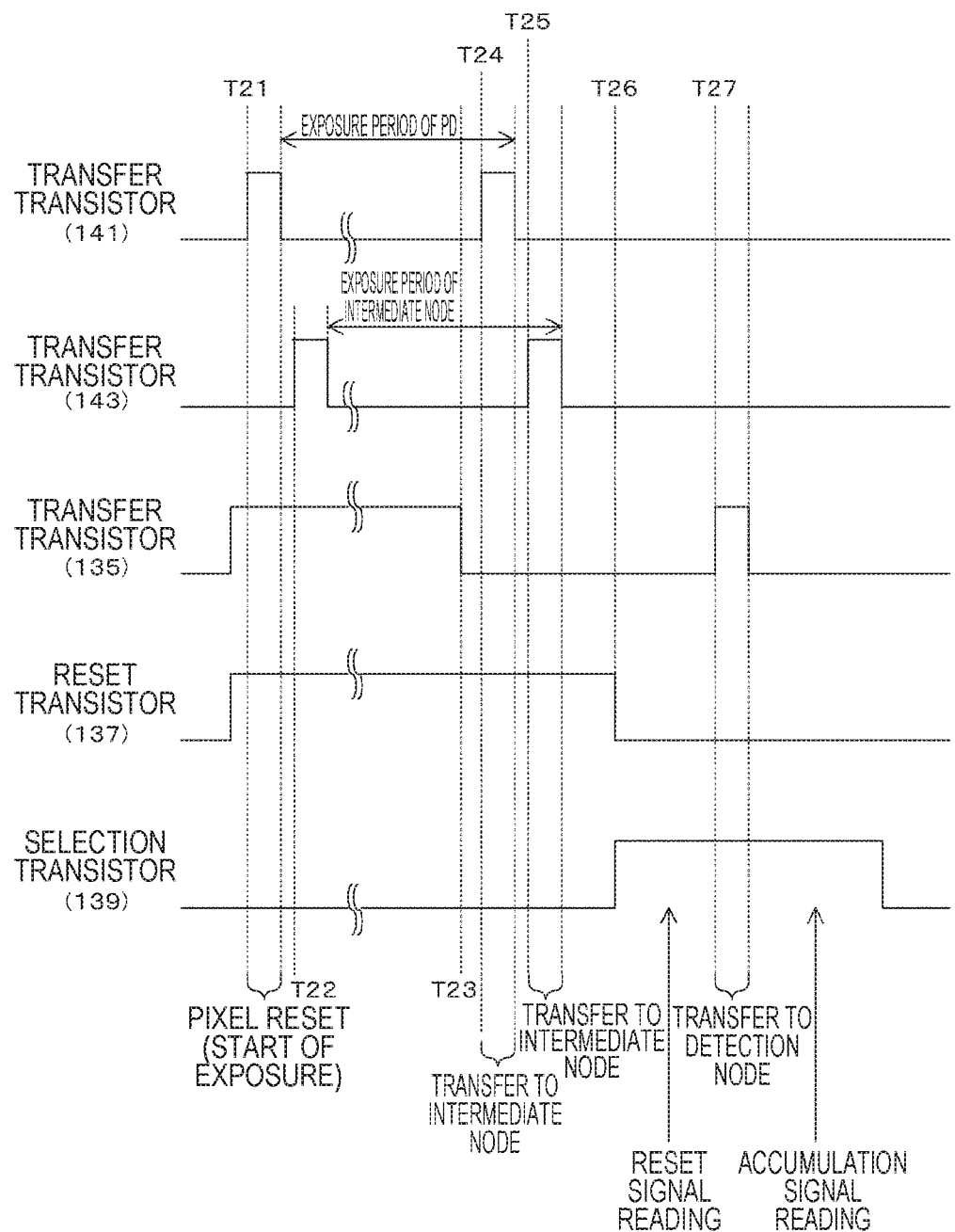
FIG. 16 is a timing chart showing an example of an operation of the pixel circuit according to the third embodiment.

FIG. 16 is a timing chart showing an example of an operation of the pixel circuit 130 according to the third embodiment.

The row drive circuit 150 applies a pulse to the transfer transistor 141 with the transfer transistor 135 and the reset transistor 137 set to be on at a timing T21 before exposure. Through this control, an entire accumulated electric charge of the photodiode 131 is drawn out to a power supply, and exposure is started.

Next, the row drive circuit 150 applies a pulse to the transfer transistor 143 with the transfer transistor 135 and the reset transistor 137 set to be on at a timing T22. Through this control, the electric charge that has been photoelectrically converted in the intermediate node 142 starts being accumulated.

Then, the row drive circuit 150 controls the transfer transistor 135 to be in an off-state at a timing T23 before an end of the exposure to cause the intermediate node 144 to be in a floating state.

The row drive circuit 150 applies a pulse again to the transfer transistor 141 at a timing T24 immediately before the end of the exposure to transfer the electric charge of the photodiode 131 to the intermediate node 142. Through this control, the electric charge of the photodiode 131 joins and is added to the accumulated electric charge of the intermediate node 142. At this point, the accumulation of the electric charge of the photodiode 131, i.e., the exposure, ends. The exposure period corresponds to the period from the end of the pulse application at the timing T21 to the end of the pulse application at the timing T24.

Then, the row drive circuit 150 applies a pulse to the transfer transistor 143 at a timing T25 to transfer the electric charge of the intermediate node 142 to the intermediate node 144. The exposure period of the intermediate node 142 corresponds to the period from the timing T22 to the end of the pulse application at the timing T25.

The row drive circuit 150 performs the control at the timings T21 and T22 (the start of the exposure) and the control at the timings T24 and T25 (the end of the exposure) on all the pixels. Since the gap between the respective exposure times of the photodiode 131 and the intermediate node 142 can be 1 microsecond (μs) or shorter, the times can be regarded as substantially the same time. This collective operation realizes exposure in the global shutter method. Note that the row drive circuit 150 may perform exposure in the rolling shutter method.

Furthermore, the row drive circuit 150 controls the reset transistor 137 to be in an off-state, and the selection transistor 139 to be in an on-state at a timing T26 after the end of the exposure. Accordingly, FD reset is performed. The detection circuit 160 reads an electric signal output from pixel circuit 130 as a reset signal for the period from the end of the FD reset to a timing T27.

Then, the row drive circuit 150 applies a pulse to the transfer transistor 135 at a timing T27. Through this control, the accumulated electric charge held in the intermediate node 144 is transferred to the detection node 136.

After the transfer of the electric charge to the detection node 136, the detection circuit 160 reads an electric signal output from the pixel circuit 130 as an accumulation signal.

Note that a complete transfer of electric charge using a series MOS structure has several variations including a CCD transfer in two or more phases. Such a transfer may be used while an operation or a structure is complicated.

According to the third embodiment described above, since the electric charge is held in the rectangular area whose a plurality of sides are adjacent to the intermediate node 142, a movement distance of electric charge within the intermediate node 142 in addition to the photodiode 131 can be shortened. Accordingly, the size of each pixel can increase more than when the area is not provided.

First Modified Example

Although the image sensor 100 is used for photon detection in the first embodiment, the image sensor 100 can also be used for radiation counting. A first modified example of the first embodiment is different from the first embodiment in that the image sensor 100 is used for radiation counting.

Figure 17:
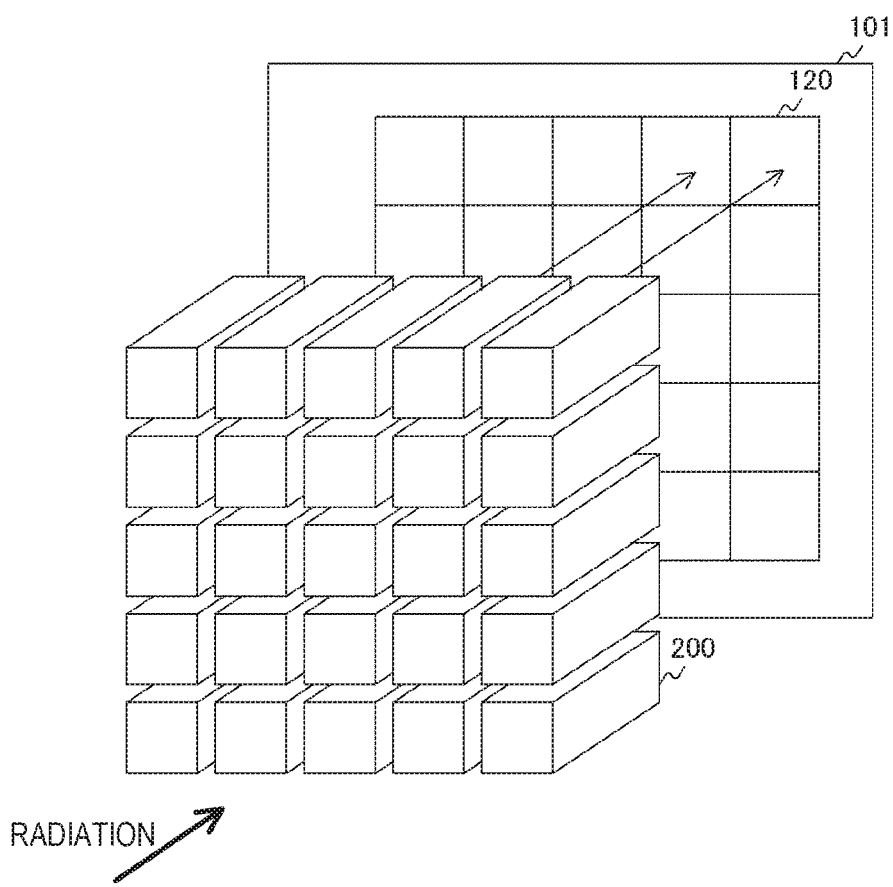
FIG. 17 is an example of a perspective diagram of a radiation counting device according to a first modified example.

FIG. 17 is a whole diagram showing an example of a configuration of a radiation counting device according to a first modified example of the first embodiment. The radiation counting device has a plurality of scintillators 200 and a semiconductor device 101. The semiconductor device 101 is provided with the image sensor 100 of the first embodiment and a digital processing unit (not illustrated).

The scintillators 200 are scintillators processed in pillar shapes or fiber shapes, and is disposed at a pitch of 1 millimeter (mm), for example. Each of the scintillator 200 is isolated by a partition which reflects light so that scintillation light is confined therein.

In the semiconductor device 101, a pixel array unit 120 is logically divided into 1-square-millimeter (mm²) regions corresponding to the scintillators 200. By connecting the scintillator 200 and the image sensor 100, the scintillation light generated in the scintillators 200 is selectively radiated to the corresponding compartments in the pixel array unit 120, and then the light amount is measured.

The digital processing unit in the semiconductor device 101 classifies energy of incident radiation based on the light emission amount of the scintillators 200 and measures the incident frequency based on the number of times of the light emission.

For example, when it is assumed that the size of each pixel of the semiconductor device 101 is about 4×4 square micrometers (μm²), 250×250 (=62,500) pixel circuits 130 are included in the compartments of the pixel array unit 120. Determination of a light amount is elicited by totalizing pixel outputs of the compartments. Each pixel output is a grayscale-determined digital value such as one with 12 bits.

For each scintillator 200, for example, a cerium doped lutetium yttrium orthosilicate (LYSO:Ce) is used. In this case, the light emission amount when gamma rays of 662 keV enter is about 10,000 photons, and therefore the light receiving amount of each pixel is 0 photon or 1 photon in many cases. Random noise of each pixel is added thereto.

In the gradation determination, it is desirable for the minimum resolution (least significant bit value or LSB) to be sufficiently smaller than 1 photon, and thus the total noise amount is maintained in a stable range. For example, when random noise of each pixel is about one electron signal (rms), the total of the pixel noise of the compartments is about 250 electron signals (rms).

In other words, by dividing the scintillators into a plurality of compartments, it is possible to restrict light receiving pixels for incidence of one radiation to be in its compartment, and thereby to reduce the total noise. Furthermore, since radiations corresponding to the number of compartments can be simultaneously counted for each frame, a counting rate improves accordingly.

Here, when each pixel is set to have an enormous size of 20×20 square micrometers ($\mu m^2$) in the image sensor 100 of the first embodiment, 50×50(=2,500) pixels are included in a pixel compartment of the semiconductor device 101. When random noise of each pixel is about 1 electron signal (rms), the total pixel noise of the compartment decreases to about 50 electron signals (rms). This value is a sufficiently smaller level than the irregularity in light emission of the scintillators 200 themselves. In other words, satisfactory energy resolution can be acquired. Furthermore, the frame rate increases as the number of pixels decreases, and thus the counting rate of radiations improves, and a dynamic range of counting can be expanded.

Such a radiation counting device can be used alone for detection of radioactive contamination or cosmic rays as a dosimeter. Furthermore, if a blank portion of the semiconductor device 101 is minimized by utilizing a stacked structure and detectors can be laid in an array shape, the radiation counting device can be used for two-dimensional imaging of radiations, like a gamma camera.

Thus, according to the first modified example, since the radiation counting device detects weak scintillation light by the image sensor 100, radiations can be counted from the detection result.

Second Modified Example

Although there are the plurality of divided scintillators 200 in the first modified example, if a pixel is set to have a large size of 100×100 square micrometers ($\mu m^2$), division of scintillators is unnecessary. A semiconductor device 101 according to a second modified example is different from the first modified example in that a scintillator is not divided.

Figure 18:
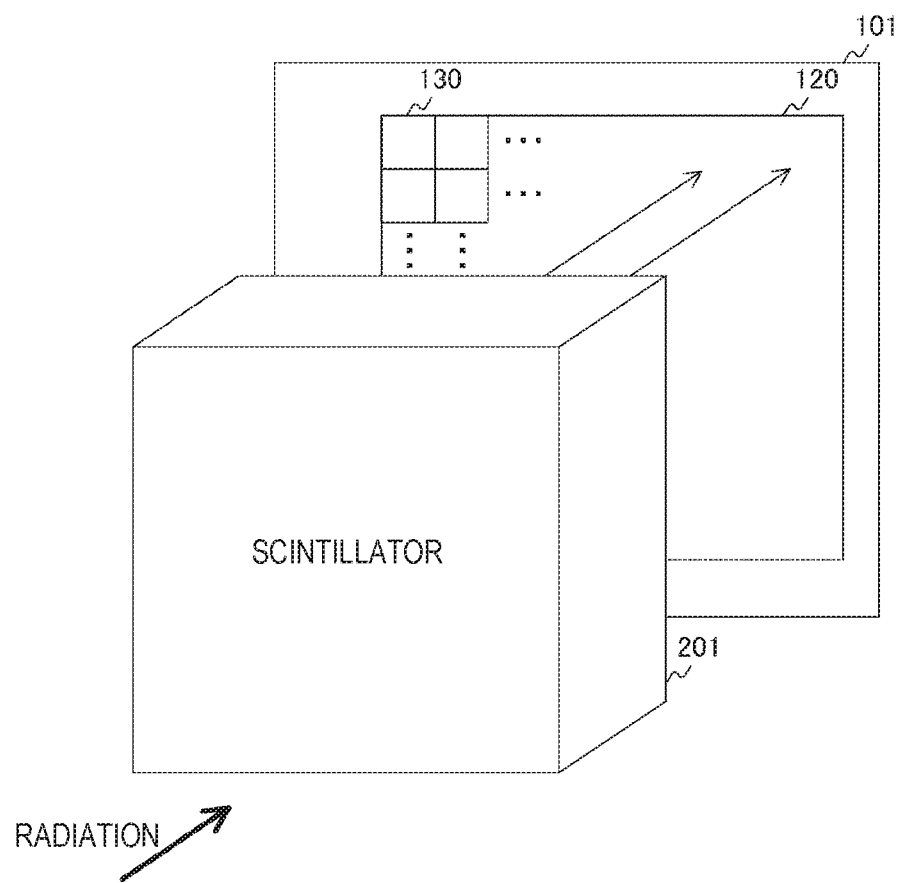
FIG. 18 is an example of a perspective diagram of a radiation counting device according to a second modified example.

FIG. 18 is an example of a perspective diagram of a radiation counting device according to the second modified example of the first embodiment. This radiation counting device includes one scintillator 201 that is not divided, instead of the scintillators 200. The number of pixel circuits 130 that receive light emitted from the scintillator 201 included in a chip opening of 5×5 square millimeters ($mm^2$) is 50×50(=2,500). When random noise of each pixel is about one electron signal (rms), the total pixel noise of compartments is 50 electron signals (rms).

Since scintillation light from the one scintillator 201 is detected according to the second modified example as described above, it is not necessary to provide a partition or the like for compartmentalizing the scintillator.

Third Modified Example

Although the detection circuits 160 are provided in respective columns in the first embodiment, a configuration in which the pixel array unit 120 is divided into a plurality of pixel blocks and detection circuits 160 are provided for the respective pixel blocks is possible. If each of the pixel blocks is set to, for example, correspond to one compartment of the scintillator of the first modified example, and the pixel blocks are used by being operated in parallel all together, a radiation detector with ample flexibility can be configured. For example, a process of adding a pixel output to each compartment in the detection circuit 160 to reduce an amount of data output from a chip, or a process of masking a compartment that includes defective pixels to set an output thereof to zero at all times can be easily executed. An image sensor 102 of the third modified example is different from that of the first embodiment in that the detection circuits 160 are provided for respective pixel blocks.

Figure 19:
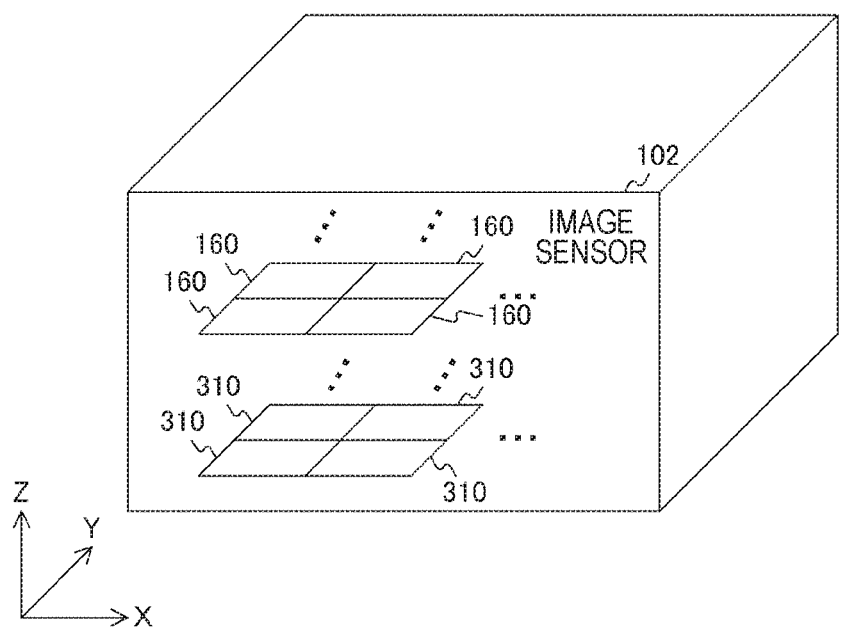
FIG. 19 is an example of a perspective diagram of an image sensor according to a third modified example.

FIG. 19 is an example of a perspective diagram of the image sensor 102 according to the third modified example of the first embodiment. This image sensor 102 includes a plurality of pixel blocks 310 and a plurality of detection circuits 160.

Each pixel block 310 includes a plurality of (2×2, etc.) pixel circuits 130. In addition, the pixel blocks 310 are arrayed in a two-dimensional matrix shape, and one detection circuit 160 is stacked in each of the pixel blocks 310. These pixel blocks 310 and the detection circuits 160 are formed in different silicon layers. Note that, in FIG. 19, configurations such as the constant current circuit 110, the row drive circuit 150, the output circuit 180, and the like are omitted.

Each row constituted by the pixel circuits 130 is selected by the row drive circuit 150 in units of rows, and then, at the time of outputting, a switch 170 selects a column, and the detection circuit 160 detects a signal.

Figure 20:
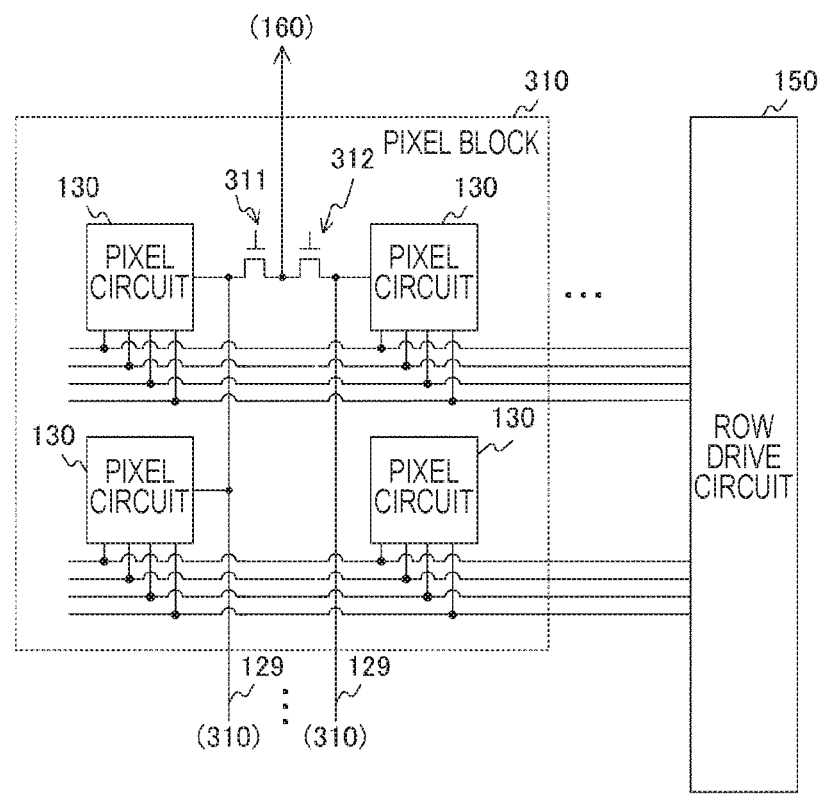
FIG. 20 is a circuit diagram showing an example of a pixel block according to the third modified example.

FIG. 20 is a circuit diagram showing an example of the pixel block 310 according to the third modified example of the first embodiment. The pixel block 310 includes 2×2 pixel circuits 130, and switches 311 and 312.

An end of the switch 311 is connected to one vertical signal line 129 of two columns in the pixel block 310, and the other thereof is connected to the detection circuit 160 corresponding to the switch 312. In addition, an end of the switch 312 is connected to the other vertical signal line 129 of the two columns in the pixel block 310, and the other thereof is connected to the detection circuit 160 corresponding to the switch 311.

When the pixel block 310 is selected, these switches 311 and 312 output an output signal of the pixel block 310 to the detection circuit 160.

According to the third modified example as described above, since the detection circuit 160 is provided in each pixel block, the image sensor 102 can detect light in each pixel block.

The above-described embodiments are examples for embodying the present technology, and matters in the embodiments each have a corresponding relationship with disclosure-specific matters in the claims. Likewise, the matters in the embodiments and the disclosure-specific matters in the claims denoted by the same names have a corresponding relationship with each other. However, the present technology is not limited to the embodiments, and various modifications of the embodiments may be embodied in the scope of the present technology without departing from the spirit of the present technology.

The processing sequences that are described in the embodiments described above may be handled as a method having a series of sequences or may be handled as a program for causing a computer to execute the series of sequences and as a recording medium storing the program. As the recording medium, a compact disc (CD), a MiniDisc (MD), and a digital versatile disc (DVD), a memory card, and a Blu-ray disc (a registered trademark) can be used.

In addition, the effects described in the present specification are not limiting but are merely examples, and there may be additional effects.

Additionally, the present technology may also be configured as below.

(1)

A pixel circuit including:

a photoelectric conversion unit configured to convert light into electric charge;

an electric charge accumulation unit configured to accumulate the electric charge in a polygonal area whose plurality of sides are adjacent to the photoelectric conversion unit on a light receiving surface;

a voltage generation unit configured to accumulate the electric charge and generate a voltage according to an amount of the accumulated electric charge;

a first transfer unit configured to transfer the electric charge from the photoelectric conversion unit to the electric charge accumulation unit when an instruction on a transfer to the electric charge accumulation unit is issued; and a second transfer unit configured to transfer the electric charge from the electric charge accumulation unit to the voltage generation unit when an instruction on a transfer to the voltage generation unit is issued.

(2)

The pixel circuit according to (1), wherein the electric charge accumulation unit converts light into electric charge, and accumulates the converted electric charge and the transferred electric charge.

(3)

The pixel circuit according to (1), wherein
the electric charge accumulation unit includes
a first intermediate node configured to accumulate the electric charge, and
a second intermediate node configured to accumulate the electric charge in a polygonal area whose plurality of sides are adjacent to the first intermediate node, and
the first transfer unit includes
a first transfer transistor configured to transfer the electric charge from the photoelectric conversion unit to the first intermediate node when an instruction on a transfer to the first intermediate node is issued, and
a second transfer transistor configured to transfer the electric charge from the first intermediate node to the second intermediate node when an instruction on a transfer to the second intermediate node is issued.

(4)

The pixel circuit according to (3), wherein at least one of the first intermediate node and the second intermediate node converts light into electric charge and accumulates the converted electric charge and the transferred electric charge.

(5)

The pixel circuit according to any one of (1) to (4), further including:

a wiring layer provided on one of two flat surfaces that the photoelectric conversion unit faces, wherein the light is radiated to a rear surface which is a surface on which the wiring layer is not provided out of the two flat surfaces.

(6)

A semiconductor photodetection device including:

a photoelectric conversion unit configured to convert light into electric charge;

an electric charge accumulation unit configured to accumulate the electric charge in a polygonal area whose plurality of sides are adjacent to the photoelectric conversion unit on a light receiving surface;

a voltage generation unit configured to accumulate the electric charge and generate a voltage according to an amount of the accumulated electric charge;

a first transfer unit configured to transfer the electric charge from the photoelectric conversion unit to the electric charge accumulation unit when an instruction on a transfer to the electric charge accumulation unit is issued;

a second transfer unit configured to transfer the electric charge from the electric charge accumulation unit to the voltage generation unit when an instruction on a transfer to the voltage generation unit is issued; and a detection unit configured to detect a light amount of light based on the generated voltage.

(7)

A radiation counting device including:

a scintillator configured to emit scintillation light when a radiation enters;

a pixel array unit that has a plurality of pixel circuits each of which includes a photoelectric conversion unit configured to convert the scintillation light into electric charge, an electric charge accumulation unit configured to accumulate the electric charge in a polygonal area whose plurality of sides are adjacent to the photoelectric conversion unit on a light receiving surface, a voltage generation unit configured to accumulate the electric charge and generate a voltage according to an amount of the accumulated electric charge, a first transfer unit configured to transfer the electric charge from the photoelectric conversion unit to the electric charge accumulation unit when an instruction on a transfer to the electric charge accumulation unit is issued, and a second transfer unit configured to transfer the electric charge from the electric charge accumulation unit to the voltage generation unit when an instruction on a transfer to the voltage generation unit is issued; and a detection unit configured to detect a light amount of light based on the generated voltage.

(8)

The radiation counting device according to (7), wherein
the scintillator is divided into a plurality of compartments, and
the detection unit detects the light amount of light of each of the plurality of compartments.

(9)

The radiation counting device according to (7), wherein the detection unit detects the light amount of each of the plurality of pixel circuits.

(10)

The radiation counting device according to (7), wherein
the pixel array unit is divided into a plurality of pixel blocks each having a predetermined number of the pixel circuits, and
the detection unit detects the light amount of each of the plurality of pixel blocks.

REFERENCE SIGNS LIST 100, 102 image sensor
101 semiconductor device
110 constant current circuit
111 MOS transistor
120 pixel array unit
130 pixel circuit
131 photodiode 132 node
133, 135, 141, 143 transfer transistor
134, 142, 144 intermediate node
136 detection node
137 reset transistor
138 amplifier transistor
139 selection transistor
150 row drive circuit
160 detection circuit
170, 311, 312 switch
180 output circuit
200, 201 scintillator
310 pixel block
510 n⁻ substrate
511 support wafer
520 light receiving unit
521 p layer
522, 524, 531 n⁻ layer
523 p⁺ layer
525, 532 p⁻ layer
526, 529, 530, 533 gate electrode
527 element isolation region
528 n⁺ diffusion layer
540 wiring layer
550 light shielding layer

What is claimed is:

1. A pixel circuit comprising:
a photoelectric conversion unit configured to convert light into electric charge;
an electric charge accumulation unit configured to accumulate the electric charge in a polygonal area whose plurality of sides are adjacent to the photoelectric conversion unit on a light receiving surface, wherein the electric charge accumulation unit includes:
a first intermediate node configured to accumulate the electric charge; and
a second intermediate node configured to accumulate the electric charge in a polygonal area whose plurality of sides are adjacent to the first intermediate node;
a voltage generation unit configured to accumulate the electric charge and generate a voltage according to an amount of the accumulated electric charge;
a first transfer unit configured to transfer the electric charge from the photoelectric conversion unit to the electric charge accumulation unit when an instruction on a transfer to the electric charge accumulation unit is issued, wherein the first transfer unit includes:
a first transfer transistor configured to transfer the electric charge from the photoelectric conversion unit to the first intermediate node when an instruction on a transfer to the first intermediate node is issued; and
a second transfer transistor configured to transfer the electric charge from the first intermediate node to the second intermediate node when an instruction on a transfer to the second intermediate node is issued; and
a second transfer unit configured to transfer the electric charge from the electric charge accumulation unit to the voltage generation unit when an instruction on a transfer to the voltage generation unit is issued.

2. The pixel circuit according to claim 1, wherein the electric charge accumulation unit converts light into electric charge, and accumulates the converted electric charge and the transferred electric charge.

3. The pixel circuit according to claim 1, wherein at least one of the first intermediate node and the second intermediate node converts light into electric charge and accumulates the converted electric charge and the transferred electric charge.

4. The pixel circuit according to claim 1, further comprising:
a wiring layer provided on one of two flat surfaces that the photoelectric conversion unit faces,
wherein the light is radiated to a rear surface which is a surface on which the wiring layer is not provided out of the two flat surfaces.

5. A semiconductor photodetection device comprising:
a photoelectric conversion unit configured to convert light into electric charge;
an electric charge accumulation unit configured to accumulate the electric charge in a polygonal area whose plurality of sides are adjacent to the photoelectric conversion unit on a light receiving surface, wherein the electric charge accumulation unit includes:
a first intermediate node configured to accumulate the electric charge; and
a second intermediate node configured to accumulate the electric charge in a polygonal area whose plurality of sides are adjacent to the first intermediate node;
a voltage generation unit configured to accumulate the electric charge and generate a voltage according to an amount of the accumulated electric charge;
a first transfer unit configured to transfer the electric charge from the photoelectric conversion unit to the electric charge accumulation unit when an instruction on a transfer to the electric charge accumulation unit is issued, wherein the first transfer unit includes:
a first transfer transistor configured to transfer the electric charge from the photoelectric conversion unit to the first intermediate node when an instruction on a transfer to the first intermediate node is issued; and
a second transfer transistor configured to transfer the electric charge from the first intermediate node to the second intermediate node when an instruction on a transfer to the second intermediate node is issued;
a second transfer unit configured to transfer the electric charge from the electric charge accumulation unit to the voltage generation unit when an instruction on a transfer to the voltage generation unit is issued; and
a detection unit configured to detect a light amount of light based on the generated voltage.

6. A radiation counting device comprising:
a scintillator configured to emit scintillation light when a radiation enters;
a pixel array unit that has a plurality of pixel circuits each of which includes a photoelectric conversion unit configured to convert the scintillation light into electric charge, an electric charge accumulation unit configured to accumulate the electric charge in a polygonal area whose plurality of sides are adjacent to the photoelectric conversion unit on a light receiving surface, wherein the electric charge accumulation unit includes a first intermediate node configured to accumulate the electric charge and a second intermediate node configured to accumulate the electric charge in a polygonal area whose plurality of sides are adjacent to the first intermediate node, a voltage generation unit configured to accumulate the electric charge and generate a voltage according to an amount of the accumulated electric charge, a first transfer unit configured to transfer the electric charge from the photoelectric conversion unit to the electric charge accumulation unit when an instruction on a transfer to the electric charge accumulation unit is issued, wherein the first transfer unit includes a first transfer transistor configured to transfer the electric charge from the photoelectric conversion unit to the first intermediate node when an instruction on a transfer to the first intermediate node is issued and a second transfer transistor configured to transfer the electric charge from the first intermediate node to the second intermediate node when an instruction on a transfer to the second intermediate node is issued, and a second transfer unit configured to transfer the electric charge from the electric charge accumulation unit to the voltage generation unit when an instruction on a transfer to the voltage generation unit is issued; and a detection unit configured to detect a light amount of light based on the generated voltage.

7. The radiation counting device according to claim 6, wherein the scintillator is divided into a plurality of compartments, and the detection unit detects the light amount of light of each of the plurality of compartments.

8. The radiation counting device according to claim 6, wherein the detection unit detects the light amount of each of the plurality of pixel circuits.

9. The radiation counting device according to claim 6, wherein the pixel array unit is divided into a plurality of pixel blocks each having a predetermined number of the pixel circuits, and the detection unit detects the light amount of each of the plurality of pixel blocks.

* * * * *